(12) United States Patent
Buyandalai et al.

(10) Patent No.: US 10,797,229 B2
(45) Date of Patent: Oct. 6, 2020

(54) MAGNETIC MEMORY DEVICE

(71) Applicant: Kabushiki Kaisha Toshiba, Minato-ku (JP)

(72) Inventors: Altansargai Buyandalai, Kawasaki (JP); Satoshi Shirotori, Yokohama (JP); Yuichi Ohsawa, Yokohama (JP); Hideyuki Sugiyama, Kawasaki (JP); Mariko Shimizu, Nerima (JP); Hiroaki Yoda, Kawasaki (JP); Tomoaki Inokuchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/423,805

(22) Filed: May 28, 2019

(65) Prior Publication Data

US 2019/0280189 A1    Sep. 12, 2019

Related U.S. Application Data

(62) Division of application No. 15/704,921, filed on Sep. 14, 2017, now Pat. No. 10,347,820.

(30) Foreign Application Priority Data

Dec. 2, 2016    (JP) .................................. 2016-235451

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *G11C 11/1675* (2013.01);
(Continued)

(58) Field of Classification Search
CPC ..... H01L 43/02; H01L 27/228; G11C 11/161; G11C 11/1675
(Continued)

(56) References Cited

U.S. PATENT DOCUMENTS 9,218,864 B1    12/2015 Yi et al.
2012/0286339 A1*    11/2012 Asao ..................... H01L 27/228
257/295
(Continued)

FOREIGN PATENT DOCUMENTS

JP    2014-45196 A    3/2014
JP    2016-129206 A    7/2016
(Continued)

*Primary Examiner* — Anthan Tran
(74) *Attorney, Agent, or Firm* — Oblon, McClelland, Maier & Neustadt, L.L.P.

(57) ABSTRACT

According to one embodiment, a magnetic memory device includes a conductive layer, first to fourth magnetic layers, first and second intermediate layers, and a controller. The conductive layer includes first, to fifth portions. The first magnetic layer is separated from the third portion. The second magnetic layer is provided between the third portion and the first magnetic layer. The first intermediate layer is provided between the first and second magnetic layers. The third magnetic layer is separated from the fourth portion. The fourth magnetic layer is provided between the fourth portion and the third magnetic layer. The second intermediate layer is provided between the third and fourth magnetic layers. The controller is electrically connected to the first and second portions. The controller implements a first operation of supplying a first current to the conductive layer, and a second operation of supplying a second current to the conductive layer.

8 Claims, 20 Drawing Sheets

(51) Int. Cl.
  *H01L 43/08*     (2006.01)
  *H01L 27/22*     (2006.01)
  *H01L 43/12*     (2006.01)

(52) U.S. Cl.
  CPC .......... *H01L 27/222* (2013.01); *H01L 27/228* (2013.01); *H01L 43/08* (2013.01); *H01L 43/12* (2013.01)

(58) Field of Classification Search
  USPC ........................................................ 365/158
  See application file for complete search history.

(56) References Cited

U.S. PATENT DOCUMENTS

| | | |
|---|---|---|
| 2014/0056060 A1* | 2/2014 | Khvalkovskiy ....... H01L 27/228 365/158 |
| 2014/0299950 A1* | 10/2014 | Kim ..................... H01L 27/228 257/421 |
| 2015/0041934 A1 | 2/2015 | Khvalkovskiy et al. |
| 2015/0200003 A1 | 7/2015 | Buhrman et al. |
| 2016/0142012 A1 | 5/2016 | Wang et al. |
| 2017/0117323 A1 | 4/2017 | Braganca et al. |
| 2017/0169872 A1 | 6/2017 | Yoda et al. |
| 2018/0040812 A1 | 2/2018 | Shimizu et al. |

FOREIGN PATENT DOCUMENTS

| | | |
|---|---|---|
| JP | 2017-112358 A | 6/2017 |
| JP | 6271653 B1 | 1/2018 |

\* cited by examiner

MAGNETIC MEMORY DEVICE

CROSS-REFERENCE TO RELATED APPLICATIONS

This application is a divisional application in U.S. Ser. No. 15/704,921, filed Sep. 14, 2017, which is based upon and claims the benefit of priority from Japanese Patent Application No. 2016-235451, filed on Dec. 2, 2016; the entire contents of which are incorporated herein by reference.

FIELD

Embodiments described herein relate generally to a magnetic memory device.

BACKGROUND

It is desirable to reduce the power consumption of a magnetic memory device.

DETAILED DESCRIPTION

Figure 1A:
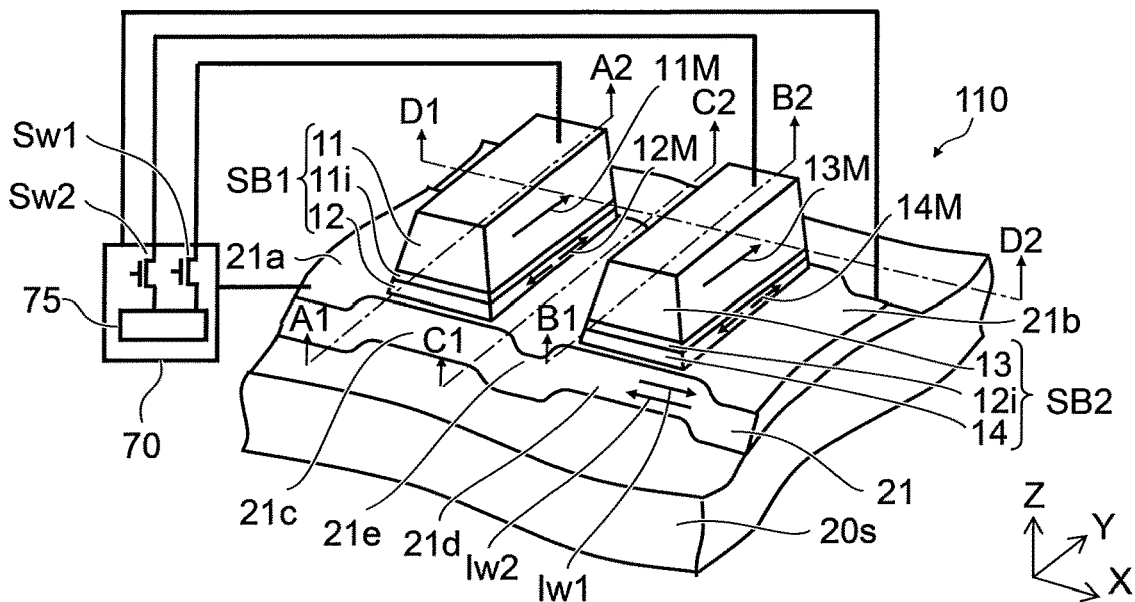
FIG. 1A to FIG. 1D are schematic views illustrating a magnetic memory device according to a first embodiment.

According to one embodiment, a magnetic memory device includes a conductive layer, first to fourth magnetic layers, a first intermediate layer, a second intermediate layer, and a controller. The conductive layer includes a first portion, a second portion, a third portion between the first portion and the second portion, a fourth portion between the third portion and the second portion, and a fifth portion between the third portion and the fourth portion. The first magnetic layer is separated from the third portion in a first direction crossing a second direction, the second direction being from the first portion toward the second portion. The second magnetic layer is provided between the third portion and the first magnetic layer. The first intermediate layer is provided between the first magnetic layer and the second magnetic layer, and is nonmagnetic. The third magnetic layer is separated from the fourth portion in the first direction. The fourth magnetic layer is provided between the fourth portion and the third magnetic layer. The second intermediate layer is provided between the third magnetic layer and the fourth magnetic layer, and is nonmagnetic. The controller is electrically connected to the first portion and the second portion. A fifth portion length along a third direction of at least a portion of the fifth portion is longer than a third portion length along the third direction of the third portion and longer than a fourth portion length along the third direction of the fourth portion. The third direction crosses the first direction and the second direction. The controller implements a first operation of supplying a first current to the conductive layer from the first portion toward the second portion, and a second operation of supplying a second current to the conductive layer from the second portion toward the first portion.

According to another embodiment, a magnetic memory device includes a conductive layer, first and second magnetic layers, and a first intermediate layer. The conductive layer includes a first portion, a second portion, and a third portion between the first portion and the second portion. The first magnetic layer is separated from the third portion in a first direction crossing a second direction. The second direction is from the first portion toward the second portion. The second magnetic layer is provided between the third portion and the first magnetic layer. The first intermediate layer is provided between the first magnetic layer and the second magnetic layer, and is nonmagnetic. The conductive layer includes a region not overlapping the second magnetic layer in the first direction. A length along a third direction of at least a portion of the region is longer than a third portion length along the third direction of the third portion. The third direction crosses the first direction and the second direction.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1D are schematic views illustrating a magnetic memory device according to a first embodiment.

Figure 1B:
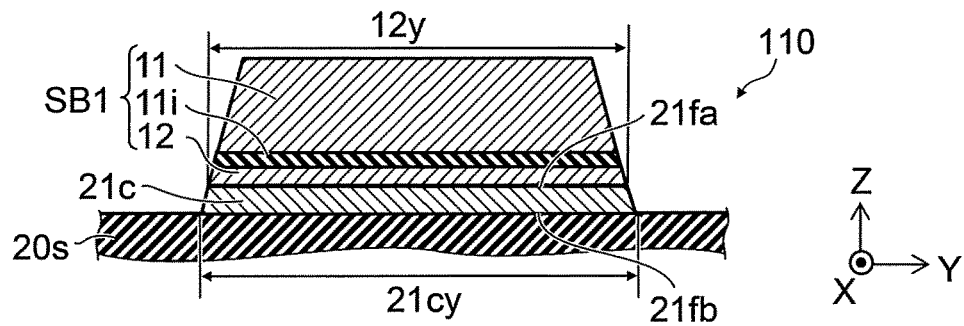
Figure 1C:
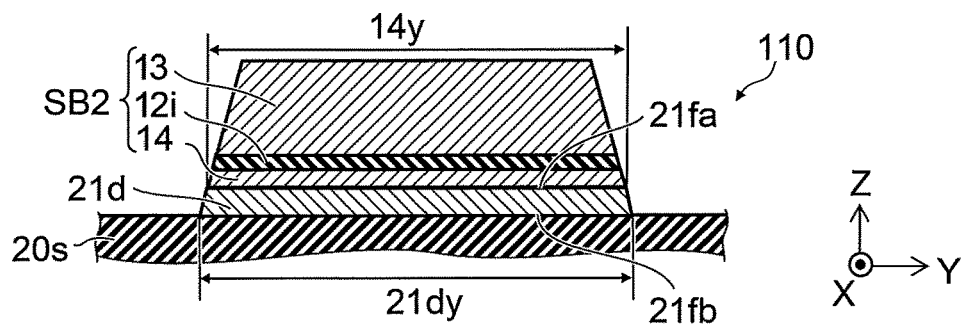
Figure 1D:
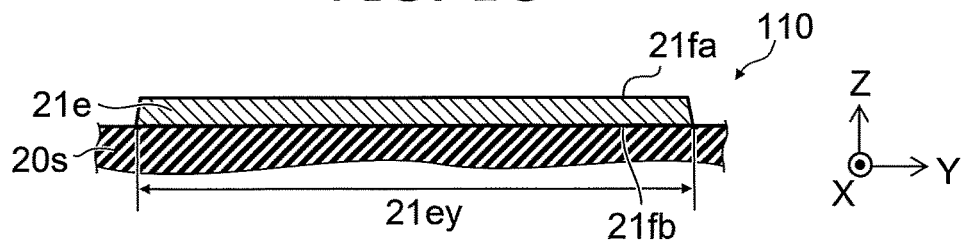

FIG. 1A is a perspective view. FIG. 1B is a line A1-A2 cross-sectional view of FIG. 1A. FIG. 1C is a line B1-B2 cross-sectional view of FIG. 1A. FIG. 1D is a line C1-C2 cross-sectional view of FIG. 1A.

Figure 2:
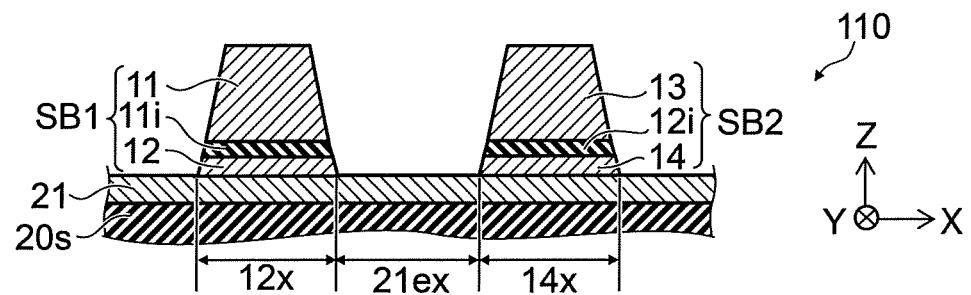
FIG. 2 is a schematic cross-sectional view illustrating the magnetic memory device according to the first embodiment.

FIG. 2 is a schematic cross-sectional view illustrating the magnetic memory device according to the first embodiment.

FIG. 2 is a line D1-D2 cross-sectional view of FIG. 1A.

As shown in FIG. 1A to FIG. 1D, the magnetic memory device 110 according to the embodiment includes a conductive layer 21, a first magnetic layer 11, a second magnetic layer 12, a first intermediate layer 11i, a third magnetic layer 13, a fourth magnetic layer 14, a second intermediate layer 12i, and a controller 70.

The first magnetic layer 11, the second magnetic layer 12, and the first intermediate layer 11i are included in a first stacked body SB1. The third magnetic layer 13, the fourth magnetic layer 14, and the second intermediate layer 12i are included in a second stacked body SB2. These stacked bodies each correspond to one memory portion (memory cell). Thus, multiple stacked bodies are provided in the magnetic memory device 110. The number of stacked bodies is arbitrary.

The conductive layer 21 is provided on a base body 20s. The stacked bodies recited above are provided on the conductive layer 21. The base body 20s may be at least a portion of a substrate. The base body 20s is, for example, insulative. The base body 20s may include, for example, a substrate including at least one of silicon oxide or aluminum oxide, etc. The silicon oxide is, for example, thermally-oxidized silicon.

The conductive layer 21 includes, for example, tantalum (Ta), etc. The conductive layer 21 is non-magnetic, for example. Examples of the material of the conductive layer 21 are described below.

The conductive layer 21 includes first to fifth portions 21a to 21e. The third portion 21c is positioned between the first portion 21a and the second portion 21b. The fourth portion 21d is positioned between the third portion 21c and the second portion 21b. The fifth portion 21e is positioned between the third portion 21c and the fourth portion 21d.

The first stacked body SB1 is provided on the third portion 21c. The second stacked body SB2 is provided on the fourth portion 21d. A stacked body is not provided on the fifth portion 21e. Insulating portions described below are provided on the fifth portion 21e.

The first magnetic layer 11 is separated along a first direction from the third portion 21c. At least a portion of the third portion 21c overlaps the first magnetic layer 11 in the first direction.

The first direction is taken as a Z-axis direction. One axis perpendicular to the Z-axis direction is taken as an X-axis direction. A direction perpendicular to the Z-axis direction and the X-axis direction is taken as a Y-axis direction.

In the conductive layer 21, the direction from the first portion 21a toward the second portion 21b is taken as a second direction. The second direction is, for example, the X-axis direction. The first direction crosses the second direction. The conductive layer 21 extends along the X-axis direction.

The second magnetic layer 12 is provided between the third portion 21c and the first magnetic layer 11. The first intermediate layer 11i is provided between the first magnetic layer 11 and the second magnetic layer 12. The first intermediate layer 11i is nonmagnetic. Another layer may be provided between the first intermediate layer 11i and the first magnetic layer 11. Another layer may be provided between the first intermediate layer 11i and the second magnetic layer 12.

The third magnetic layer 13 is separated from the fourth portion 21d in the first direction (the Z-axis direction). At least a portion of the fourth portion 21d overlaps the third magnetic layer 13 in the first direction. The fourth magnetic layer 14 is provided between the fourth portion 21d and the third magnetic layer 13. The second intermediate layer 12i is provided between the third magnetic layer 13 and the fourth magnetic layer 14. The second intermediate layer 12i is nonmagnetic. Another layer may be provided between the second intermediate layer 12i and the third magnetic layer 13. Another layer may be provided between the second intermediate layer 12i and the fourth magnetic layer 14.

The first magnetic layer 11 and the third magnetic layer 13 are, for example, fixed magnetic layers. The second magnetic layer 12 and the fourth magnetic layer 14 are, for example, free magnetic layers. A first magnetization 11M of the first magnetic layer 11 does not change easily compared to a second magnetization 12M of the second magnetic layer 12. A third magnetization 13M of the third magnetic layer 13 does not change easily compared to a fourth magnetization 14M of the fourth magnetic layer 14. For example, the first intermediate layer 11i and the second intermediate layer 12i function as tunneling layers.

The stacked bodies (the first stacked body SB1, the second stacked body SB2, etc.) function as, for example, magnetic variable resistance elements. For example, the TMR (Tunnel Magneto Resistance Effect) occurs in the stacked bodies. For example, the electrical resistance of a path including the first magnetic layer 11, the first intermediate layer 11i, and the second magnetic layer 12 changes according to the difference between the orientation of the first magnetization 11M and the orientation of the second magnetization 12M. For example, the electrical resistance of a path including the third magnetic layer 13, the second intermediate layer 12i, and the fourth magnetic layer 14 changes according to the difference between the orientation of the third magnetization 13M and the orientation of the fourth magnetization 14M. The stacked bodies include, for example, magnetic tunnel junctions (MTJs).

In the example, the first magnetization 11M and the third magnetization 13M are aligned with the Y-axis direction. The second magnetization 12M and the fourth magnetization 14M are aligned with the Y-axis direction. The first magnetic layer 11 and the third magnetic layer 13 function as, for example, reference layers. The second magnetic layer 12 and the fourth magnetic layer 14 function as, for example, memory layers.

The second magnetic layer 12 and the fourth magnetic layer 14 function as, for example, layers that store information. For example, a first state in which the second magnetization 12M is oriented in one direction corresponds to first information to be stored. A second state in which the second magnetization 12M is oriented in another direction corresponds to second information to be stored. For example, the first information corresponds to one of "0" or "1." The second information corresponds to the other of "0" or "1." Similarly, the orientation of the fourth magnetization 14M corresponds to these information.

For example, the second magnetization 12M and the fourth magnetization 14M can be controlled by a current (a program current) flowing in the conductive layer 21. For example, the orientations of the second magnetization 12M and the fourth magnetization 14M can be controlled by the orientation of the current (the program current) of the conductive layer 21. For example, the conductive layer 21 functions as, for example, a Spin Orbit Layer (SOL). For example, the orientation of the second magnetization 12M can be changed by a spin-orbit torque generated between the conductive layer 21 and the second magnetic layer 12. For example, the orientation of the fourth magnetization 14M can be changed by a spin-orbit torque generated between the conductive layer 21 and the fourth magnetic layer 14. The spin-orbit torque is based on the current (the program current) flowing in the conductive layer 21.

The current (the program current) is supplied by the controller 70. The controller includes, for example, a drive circuit 75.

The controller 70 is electrically connected to the first portion 21a, the second portion 21b, the first magnetic layer 11, and the third magnetic layer 13. In the example, a first switch element Sw1 (e.g., a transistor) is provided in the current path between the drive circuit 75 and the first magnetic layer 11. A second switch element Sw2 (e.g., a transistor) is provided in the current path between the drive circuit 75 and the third magnetic layer 13. These switch elements are included in the controller 70.

The controller 70 supplies a first current Iw1 (a first program current) to the conductive layer 21 in a first operation (a first program operation). Thereby, a first state is formed. The first current Iw1 is a current from the first portion 21a toward the second portion 21b. The controller 70 supplies a second current Iw2 (a second program current) to the conductive layer 21 in a second operation (a second program operation). Thereby, a second state is formed. The second program current Iw2 is a current from the second portion 21b toward the first portion 21a.

A first electrical resistance between the first magnetic layer 11 and the first portion 21a after the first operation (in the first state) is different from a second electrical resistance between the first magnetic layer 11 and the first portion 21a after the second operation (in the second state).

For example, the difference between these electrical resistances is based on the difference of the state of the second magnetization 12M between the first state and the second state.

A third state is formed in the second stacked body SB2 when the controller 70 supplies the first current Iw1 to the conductive layer 21. A fourth state is formed in the second stacked body SB2 when the controller 70 supplies the second current Iw2 to the conductive layer 21. A third electrical resistance between the third magnetic layer 13 and the first portion 21a in the third state is different from a fourth electrical resistance between the third magnetic layer 13 and the first portion 21a in the fourth state.

For example, the difference between these electrical resistances is based on the difference of the state of the fourth magnetization 14M between the third state and the fourth state.

In a read operation, the controller 70 may sense a characteristic (which may be a voltage, a current, etc.) corresponding to the electrical resistance between the first magnetic layer 11 and the first portion 21a. In the read operation, the controller 70 may sense a characteristic (which may be a voltage, a current, etc.) corresponding to the electrical resistance between the third magnetic layer 13 and the first portion 21a.

One of the first stacked body SB1 (a first memory cell) or the second stacked body SB2 (a second memory cell) is selected by the operations of the first switch element Sw1 and the second switch element Sw2 recited above. The program operation and the read operation are performed for the desired memory cell. Examples of the operations of the controller 70 are described below.

In the embodiment, for example, the width of at least a portion of the fifth portion 21e of the conductive layer 21 is wider than the width of the third portion 21c. For example, the width of at least a portion of the fifth portion 21e of the conductive layer 21 is wider than the width of the fourth portion 21d.

For example, a direction crossing the first direction (e.g., the Z-axis direction) and the second direction (e.g., the X-axis direction) is taken as a third direction. The third direction is, for example, the Y-axis direction.

As shown in FIG. 1B, the third portion 21c has a third portion length 21cy along the third direction. As shown in FIG. 1C, the fourth portion 21d has a fourth portion length 21dy along the third direction. As shown in FIG. 1D, the fifth portion 21e has a fifth portion length 21ey along the third direction. As shown in FIG. 1A to FIG. 1D, the fifth portion length 21ey is longer than the third portion length 21cy. The fifth portion length 21ey is longer than the fourth portion length 21dy.

The conductive layer 21 includes a region not overlapping the second magnetic layer 12 in the first direction. The length (the width) along the third direction of this region is longer than the third portion length 21cy. For example, this region is positioned to be at least one of a region between the first portion 21a and the third portion 21c or a region between the second portion 21b and the third portion 21c.

Thus, the width of the conductive layer 21 is wide at the portion where the stacked bodies are not provided. Thereby, the electrical resistance of the conductive layer 21 can be reduced.

A first reference example may be considered in which the width of the conductive layer 21 is uniform and wide. In such a case, the width is wide also at the portions (the third portion 21c and the fourth portion 21d) where the stacked bodies are provided. The magnetic effects that are applied to the second magnetic layer 12 and the fourth magnetic layer 14 from the conductive layer 21 are dependent on the current density of the region of the conductive layer 21 opposing the second magnetic layer 12 and the fourth magnetic layer 14. The current density decreases in the case where the widths of the third portion 21c and the fourth portion 21d are wide. Therefore, the current for the programming is large in the first reference example. Therefore, the power consumption increases.

On the other hand, a second reference example may be considered in which the width of the conductive layer 21 is uniform and narrow. In such a case, the current density is high at the third portion 21c and the fourth portion 21d. However, the resistance of the conductive layer 21 increases because the width of the entire conductive layer 21 is narrow. Therefore, the power consumption increases.

Conversely, in the embodiment, the current density is high because the widths of the third portion 21c and the fourth portion 21d are narrow. Then, a high resistance of the conductive layer 21 can be suppressed because the width of the fifth portion 21e is wide. In the embodiment, the program operation can be implemented efficiently; and the power consumption can be suppressed.

For example, a voltage drop occurs in the conductive layer 21 in the case where the resistance of the conductive layer 21 is high as in the second reference example recited above. Therefore, the current density changes according to the position inside the conductive layer 21. For example, the voltage that is applied to the stacked body changes according to the position inside the conductive layer 21. Therefore, the operating conditions (e.g., the program operation conditions, the read conditions, etc.) change according to the position inside the conductive layer 21. The operations easily become unstable.

Conversely, according to the embodiment, the dependence of the operating conditions on the position inside the conductive layer 21 can be suppressed because the resistance of the conductive layer 21 can be reduced. Stable operations can be implemented. Because stable operations are obtained, the memory cell (the stacked body) can be small. The storage density can be increased.

As described below, there are cases where a portion of the conductive layer 21 is removed in the patterning process of the stacked body. In such a case, there are cases where the fifth portion 21e is thinner than the third portion 21c. Also, there are cases where the fifth portion 21e is thinner than the fourth portion 21d. In such a case, the resistance of the fifth portion 21e becomes high easily. In the embodiment, the fifth portion length 21ey is longer than the third portion length 21cy and longer than the fourth portion length 21dy. Thereby, even in the case where such a thickness difference occurs, a low electrical resistance can be maintained.

In the embodiment, the fifth portion length 21ey may be taken as, for example, the maximum value of the length along the third direction (the Y-axis direction) of the portion of the conductive layer 21 (the fifth portion 21e) between the third portion 21c and the fourth portion 21d.

In the embodiment, for example, the fifth portion length 21ey is not less than 1.1 times the third portion length 21cy. For example, the fifth portion length 21ey is not less than 1.1 times the fourth portion length 21dy. In the case where the fifth portion length 21ey is not less than 1.1 times the third portion length 21cy, for example, the resistance of the fifth portion length 21ey can be reduced effectively; and the resistance of the entire conductive layer 21 can be reduced.

On the other hand, to suppress shorts, the distance between the multiple conductive layers is set to be not less than a constant. In such a case, if the fifth portion length 21ey is excessively long, for example, the pitch of the multiple conductive layers becomes large; and the storage density decreases. For example, the fifth portion length 21ey is not more than 1.5 times the third portion length 21cy. In such a case, for example, the resistance of the conductive layer 21 can be reduced effectively without substantially increasing the pitch.

In the example of the magnetic memory device 110, the fifth portion length 21ey is longer than the length in the Y-axis direction of the magnetic layers. For example, as shown in FIG. 1B, the second magnetic layer 12 has a second magnetic layer length 12y along the third direction (e.g., the Y-axis direction). The fourth magnetic layer 14 has a fourth magnetic layer length 14y along the third direction. The fifth portion length 21ey is longer than the second magnetic layer length 12y. The fifth portion length 21ey is longer than the fourth magnetic layer length 14y.

In the example, the third portion length 21cy of the third portion 21c is longer than the second magnetic layer length 12y. The fourth portion length 21dy of the fourth portion 21d is longer than the fourth magnetic layer length 14y.

As shown in FIG. 1B to FIG. 1D, the side surface of the conductive layer 21 may be tilted with respect to the Z-axis direction. In such a case, the length in the third direction relating to the conductive layer 21 may be taken as the length in the third direction at the center in the thickness direction.

For example, as shown in FIG. 1B to FIG. 1D, the conductive layer 21 has a first surface 21fa and a second surface 21fb. The first surface 21fa is the upper surface. The second surface 21fb is the lower surface. For example, at the third portion 21c, the first surface 21fa is positioned between the second surface 21fb and the second magnetic layer 12. For example, at the fourth portion 21d, the first surface 21fa is positioned between the second surface 21fb and the fourth magnetic layer 14. In the example, the length along the Y-axis direction of the first surface 21fa (the upper surface) is shorter than the length along the Y-axis direction of the second surface 21fb (the lower surface). In such a case, the length along the Y-axis direction of the center in the thickness direction of the conductive layer 21 may be used as the length in the Y-axis direction of the conductive layer 21. The average of the length along the Y-axis direction of the first surface 21fa (the upper surface) and the length along the Y-axis direction of the second surface 21fb (the lower surface) may be used as the length in the Y-axis direction of the conductive layer 21. This is similar also for the lengths relating to the magnetic layers.

As shown in FIG. 2, the length along the second direction (the X-axis direction) of the second magnetic layer 12 is taken as a length 12x. The length along the second direction (the X-axis direction) of the fourth magnetic layer 14 is taken as a length 14x. The distance along the second direction (the X-axis direction) between the second magnetic layer 12 and the fourth magnetic layer 14 is taken as a distance 21ex. The distance 21ex corresponds to the length along the second direction of the fifth portion 21e. For example, the distance 21ex may be longer than the length 12x. For example, the distance 21ex may be longer than the length 14x. In the case where the distance 21ex is long, for example, the heat of the conductive layer 21 is easy to dissipate between the two stacked bodies.

For example, the information relating to the lengths, thicknesses, widths, etc., recited above is obtained by a transmission electron microscope, etc.

Figure 3:
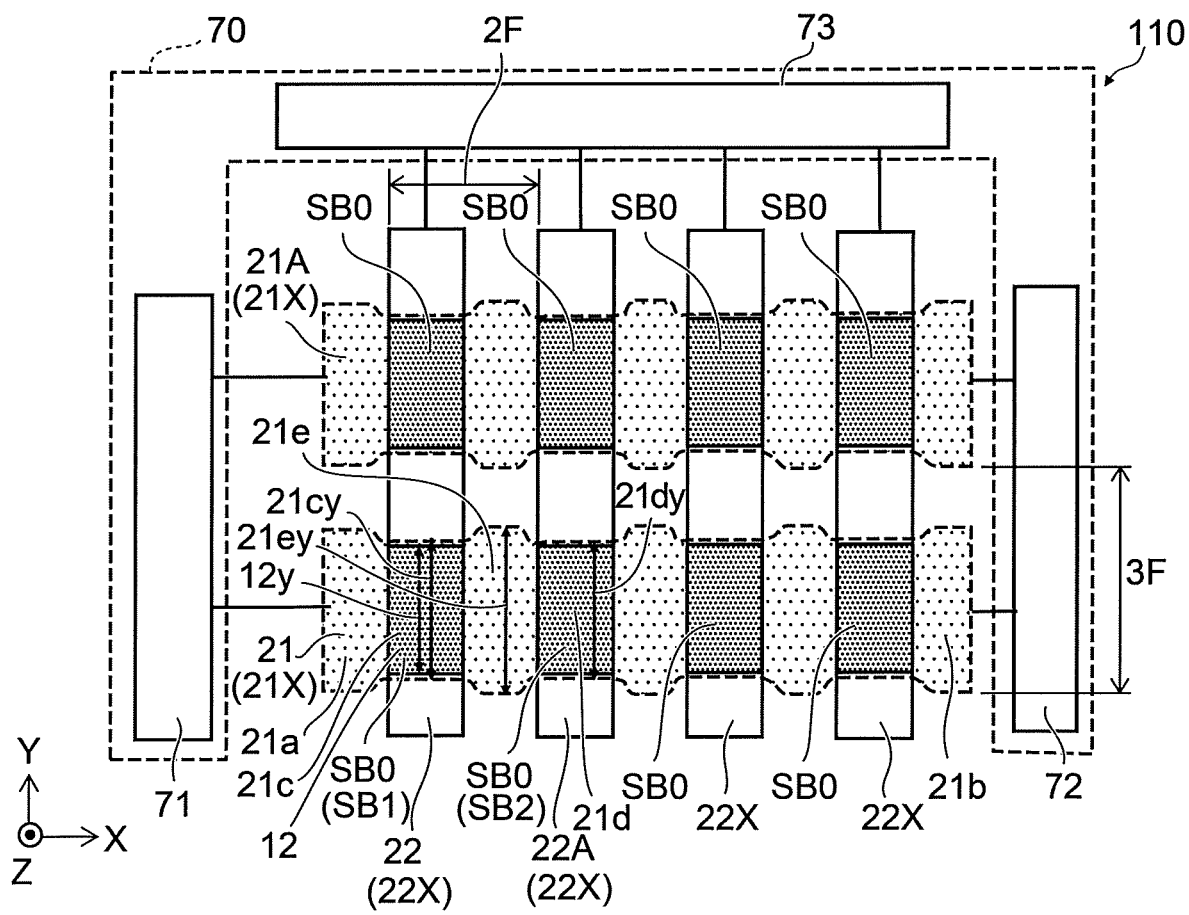
FIG. 3 is a schematic plan view illustrating the magnetic memory device according to the first embodiment.

FIG. 3 is a schematic plan view illustrating the magnetic memory device according to the first embodiment.

Figure 4:
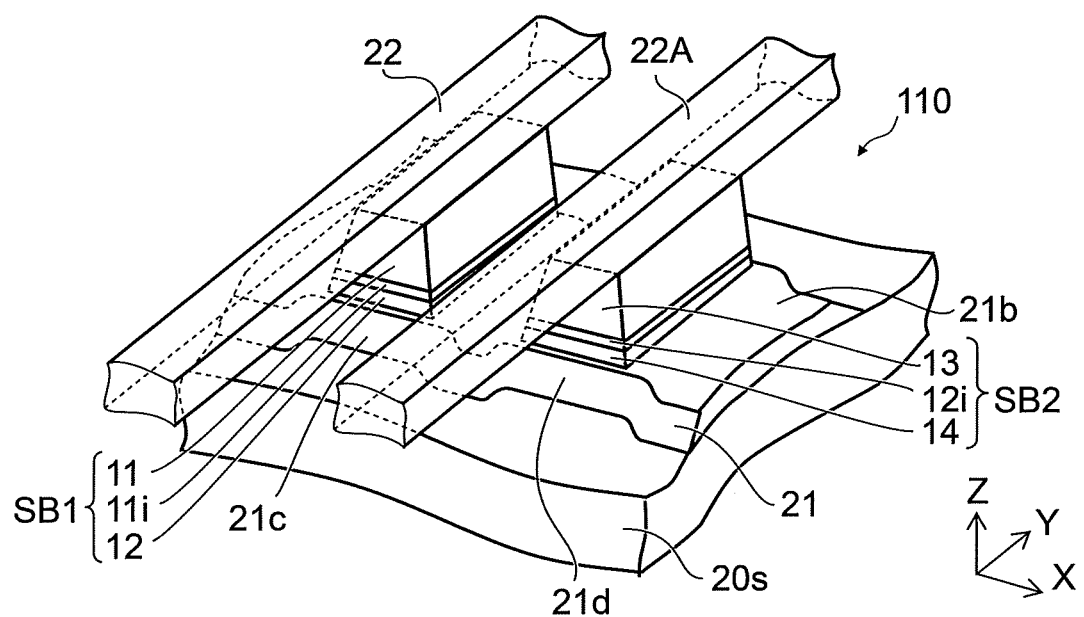
FIG. 4 is a schematic perspective view illustrating the magnetic memory device according to the first embodiment.
Figure 5A:
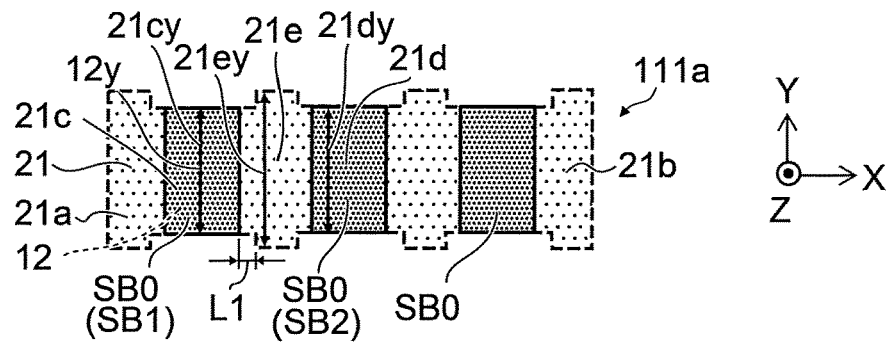
FIG. 5A to FIG. 5D are schematic plan views illustrating other magnetic memory devices according to the first embodiment.
Figure 5B:
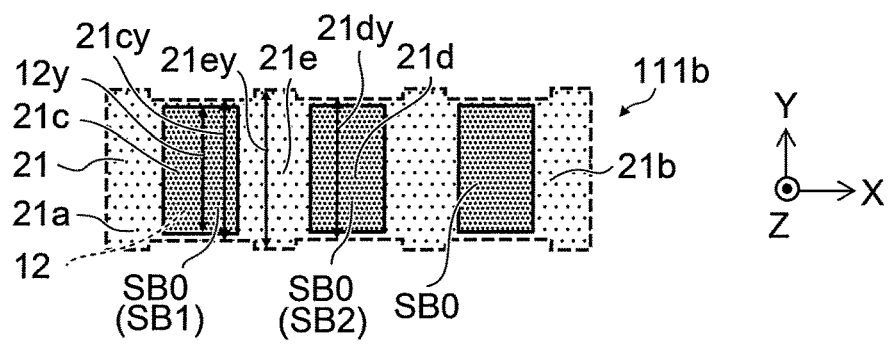
Figure 5C:
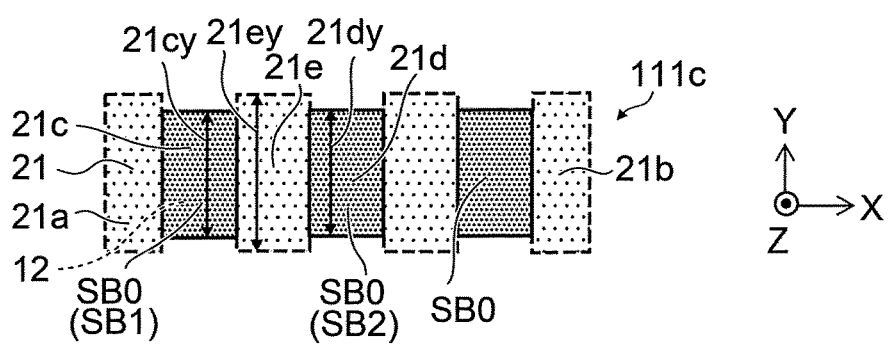
Figure 5D:
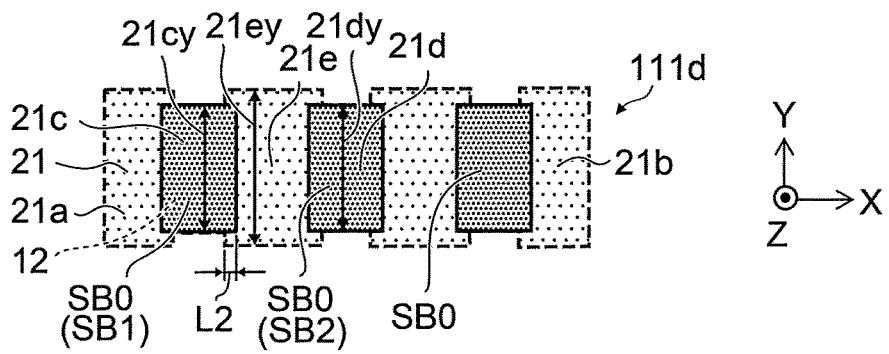
Figure 6A:
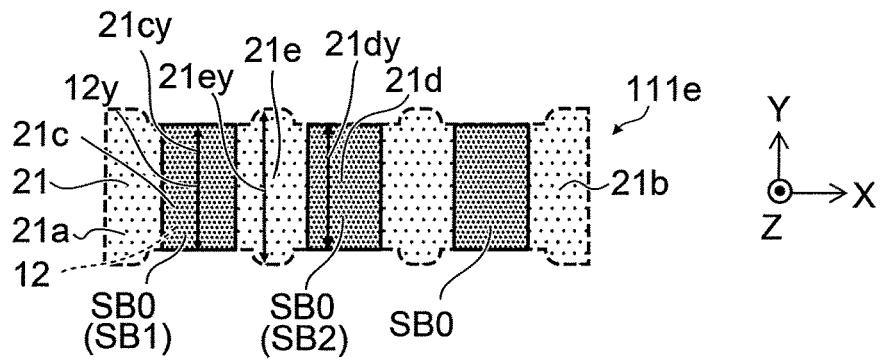
FIG. 6A to FIG. 6D are schematic plan views illustrating other magnetic memory devices according to the first embodiment.
Figure 6B:
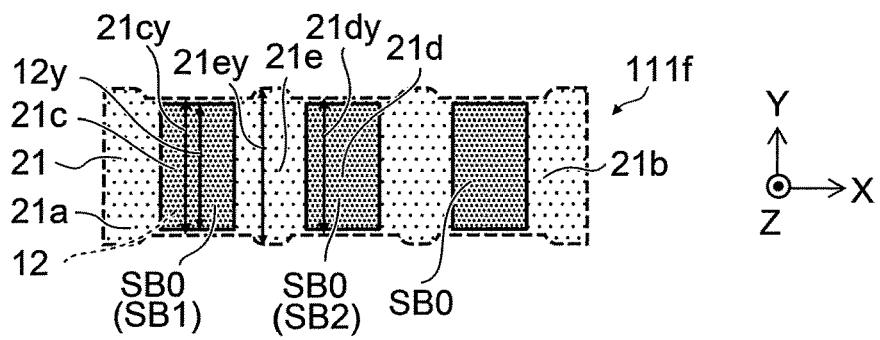
Figure 6C:
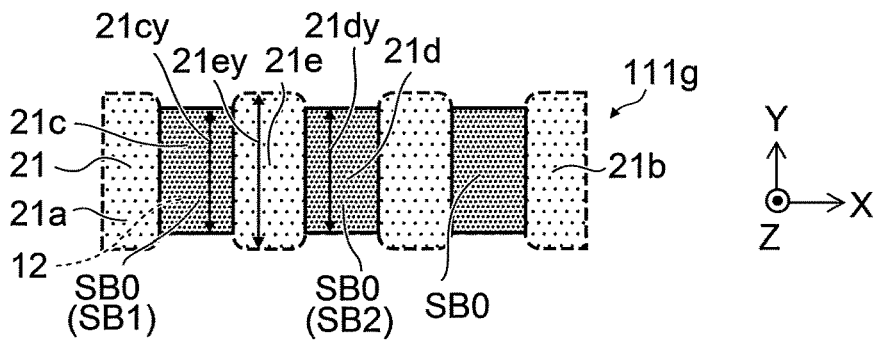
Figure 6D:
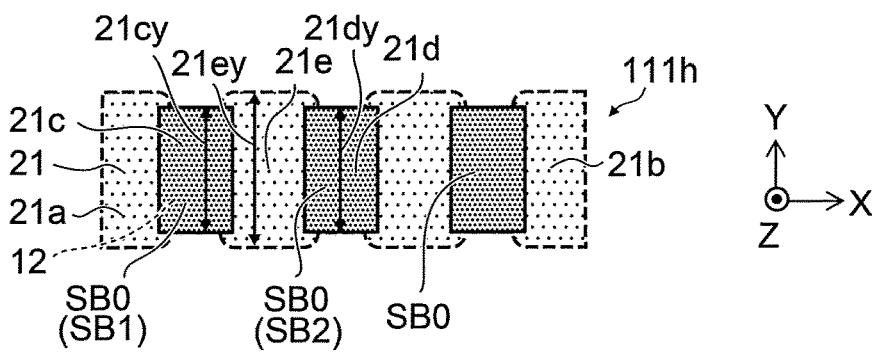

FIG. 4 is a schematic perspective view illustrating the magnetic memory device according to the first embodiment.

These drawings illustrate the configuration of the magnetic memory device 110.

As shown in FIG. 3, for example, multiple electrodes 22X and multiple conductive layers 21X are provided in the magnetic memory device 110. For example, the multiple electrodes 22X extend in the Y-axis direction. The multiple electrodes 22X are arranged in the X-axis direction. One of the multiple electrodes 22X is an electrode 22. Another one of the multiple electrodes 22X is an electrode 22A. For example, the multiple conductive layers 21X extend in the X-axis direction. The multiple conductive layers 21X are arranged in the Y-axis direction. One of the multiple conductive layers 21X is the conductive layer 21. Another one of the multiple conductive layers 21X is a conductive layer 21A.

For example, stacked bodies SB0 are provided between the multiple electrodes 22X and the multiple conductive layers 21X.

As shown in FIG. 4, for example, the first stacked body SB1 is provided between the conductive layer 21 and the electrode 22. The second stacked body SB2 is provided between the conductive layer 21 and the electrode 22A.

As shown in FIG. 3, for example, the pitch of the multiple electrodes 22X is "2F." The pitch of the multiple conductive layers 21X is, for example, "3F." "F" is, for example, the minimum patterning dimension.

As shown in FIG. 3, the controller 70 includes first to third circuits 71 to 73. The first circuit 71 is electrically connected to the first portion 21a of the conductive layer 21. The second circuit 72 is electrically connected to the second portion 21b of the conductive layer 21. The third circuit 73 is electrically connected to the first stacked body SB1 (the first magnetic layer 11) via the electrode 22. The first circuit 71 is electrically connected to one end of each of the multiple conductive layers 21X. The second circuit 72 is electrically connected to the other end of each of the multiple conductive layers 21X. The third circuit 73 is electrically connected to each of the multiple electrodes 22X. In FIG. 3, the switch elements are not illustrated (referring to FIG. 1A).

FIG. 5A to FIG. 5D are schematic plan views illustrating other magnetic memory devices according to the first embodiment.

In the magnetic memory devices 111a to 111d as shown in FIG. 5A to FIG. 5D, the widths (the third portion length 21cy, the fifth portion length 21ey, the fourth portion length 21dy, etc.) along the Y-axis direction of the conductive layer 21 change in a step configuration.

In the magnetic memory device 111a, the portion (the fifth portion 21e) of the conductive layer 21 where the width is wide is separated from the second magnetic layer 12 in the X-axis direction. The third portion length 21cy is substantially the same as the second magnetic layer length 12y. In the magnetic memory device 111a, the width of the conductive layer 21 is narrow similarly to the third portion length 21cy at a portion between the two stacked bodies SB0. In this region, for example, the effective direction of the current flowing through the conductive layer 21 is aligned with the minor-axis direction of the stacked body SB0. Thereby, for example, the spin coherence improves. Thereby, for example, the reversal speed of the second magnetization 12M of the second magnetic layer 12 becomes high. A length L1 in the X-axis direction of the region provided in the portion between the two stacked bodies SB0 where the width of the conductive layer 21 is substantially the same as the third portion length 21cy is, for example, not less than 1 nm and not more than 6 nm. Thereby, for example, the length L1 is not more than 2 times the spin diffusion length. Thereby, for example, the spin coherence increases effectively.

In the magnetic memory device 111b, the third portion length 21cy is longer than the second magnetic layer length 12y.

In the magnetic memory device 111c, the position in the X-axis direction of the boundary between the portion (the fifth portion 21e) of the conductive layer 21 where the width is wide and the portion (e.g., the third portion 21c) of the conductive layer 21 where the width is narrow substantially overlaps the position in the X-axis direction of the outer edge of the second magnetic layer 12. In the magnetic memory device 111c, it is easy to form films of mutually-different materials on the side surface along the X-axis direction of the stacked body SB0 and the side surface along the Y-axis direction of the stacked body SB0. By providing the different materials, for example, it is easy to apply an anisotropic effect (e.g., stress, etc.) to the stacked body SB0 (e.g., the MTJ element). For example, it is easy to anisotropically control the magnetic field applied from the outside to the stacked body SB0, etc. Thereby, for example, it is easy to assist the operations of the MTJ element.

In the magnetic memory device 111d, the portion of the conductive layer 21 where the width is wide overlaps a portion of the second magnetic layer 12 in the Y-axis direction. In the magnetic memory device 111d, the width of the conductive layer 21 is locally small under the stacked body SB0. Thereby, the current density increases locally. Thereby, a strong torque can be provided locally to the memory layers (the second magnetic layer 12, etc.). For example, a kernel of the reversal of the magnetization is formed. For example, the program currents (the first current Iw1, the second current Iw2, etc.) can be reduced. The power consumption can be reduced.

A length L2 in the X-axis direction of the portion where the second magnetic layer 12 and the portion of the conductive layer 21 where the width is wide overlap in the Y-axis direction is, for example, not less than 0.5 nm and not more than 3 nm. Thereby, for example, the length L2 is substantially not more than the spin diffusion length. Thereby, a high density polarized spin acts efficiently on the memory layer.

FIG. 6A to FIG. 6D are schematic plan views illustrating other magnetic memory devices according to the first embodiment.

In the magnetic memory devices 111e to 111h as shown in FIG. 6A to FIG. 6D, the widths (the third portion length 21cy, the fifth portion length 21ey, the fourth portion length 21dy, etc.) along the Y-axis direction of the conductive layer 21 change continuously. Otherwise, the configurations of the magnetic memory devices 111e to 111h are similar to the configurations of the magnetic memory devices 111a to 111d.

Figure 7A:
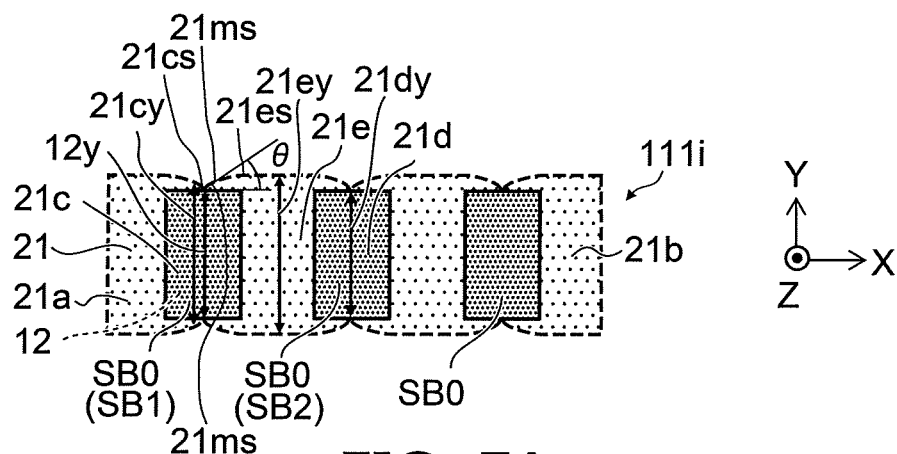
FIG. 7A and FIG. 7B are schematic plan views illustrating other magnetic memory devices according to the first embodiment.
Figure 7B:
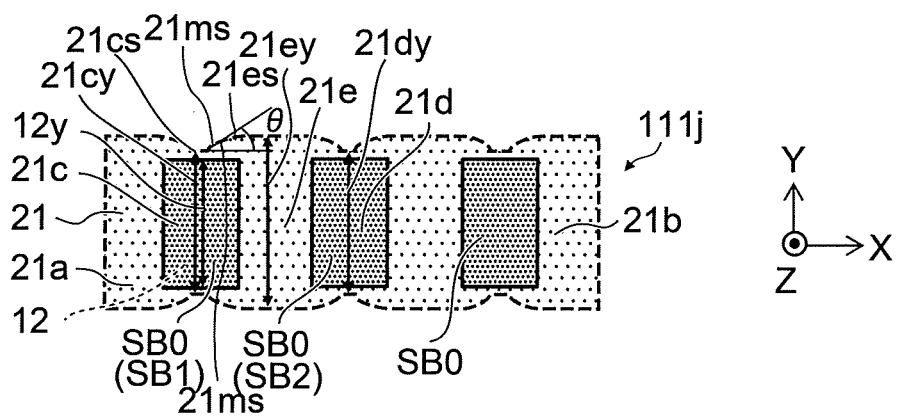
Figure 8A:
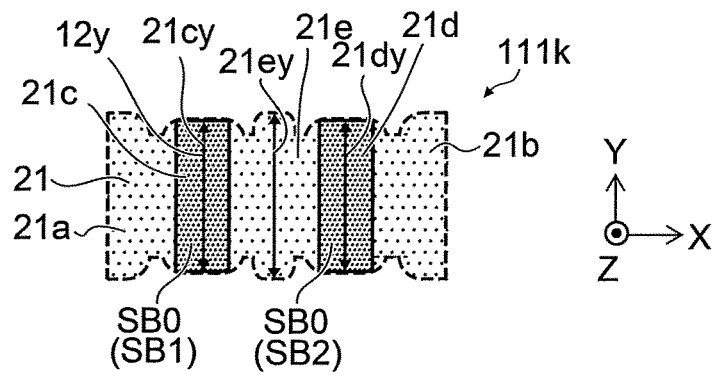
FIG. 8A to FIG. 8D are schematic plan views illustrating other magnetic memory devices according to the first embodiment.
Figure 8B:
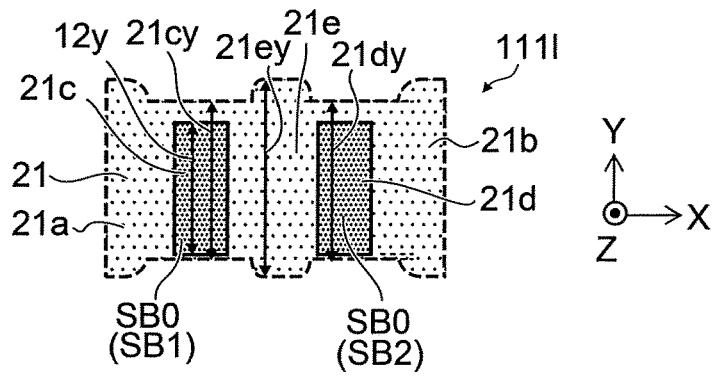
Figure 8C:
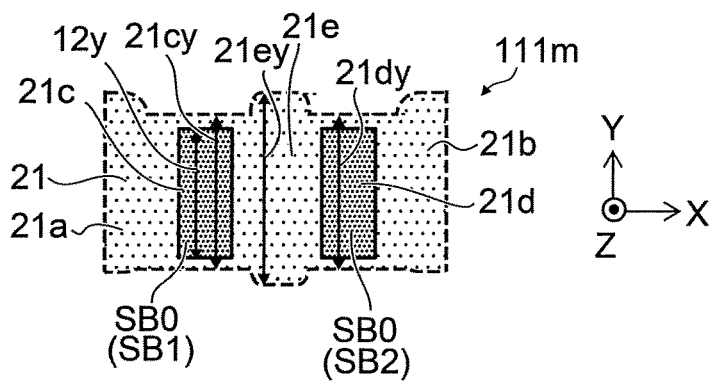
Figure 8D:
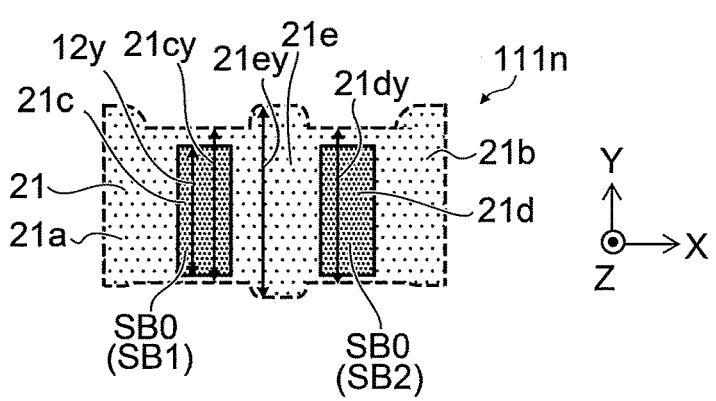

FIG. 7A and FIG. 7B are schematic plan views illustrating other magnetic memory devices according to the first embodiment.

In the magnetic memory devices 111i and 111j as shown in FIG. 7A and FIG. 7D, the width in the Y-axis direction of the conductive layer 21 changes continuously. Otherwise, the configurations of the magnetic memory devices 111i and 111j are similar to the configuration of the magnetic memory device 111a. In the magnetic memory devices 111i and 111j, the change of the width along the Y-axis direction of the conductive layer 21 is gradual compared to that of the magnetic memory devices 111e to 111h.

The conductive layer 21 includes, for example, an intermediate portion 21m between the third portion 21c and the fifth portion 21e. The third portion 21c has a third portion side surface 21cs along the second direction (the X-axis direction). The fifth portion 21e has a fifth portion side surface 21es along the second direction. The intermediate portion 21m has an intermediate portion side surface 21ms between the third portion side surface 21cs and the fifth portion side surface 21es. The angle between the intermediate portion side surface 21ms and the second direction (the X-axis direction) is taken as an angle θ. It is favorable for the angle θ to be 30 degrees or less.

In the case where the angle θ is small, for example, the direction of the current flowing through the conductive layer 21 bends gradually. On the other hand, in the case where the width in the Y-axis direction of the conductive layer 21 changes abruptly, the direction of the current changes abruptly at the corner portions at the locations where the width changes abruptly. In such a case, for example, the decrease of the spin coherence becomes large. By setting the angle θ to be small, for example, the scattering of the spin can be suppressed. The scattering of the spin can be suppressed effectively when the angle θ is 30 degrees or less.

FIG. 8A to FIG. 8D are schematic plan views illustrating other magnetic memory devices according to the first embodiment.

In magnetic memory devices 111k to 111n shown in FIG. 8A to FIG. 8D as well, the fifth portion length 21ey is longer than the third portion length 21cy. The fifth portion length 21ey is longer than the fourth portion length 21dy. In the magnetic memory device 111k, the width of the conductive layer 21 is shorter than the third portion length 21cy and shorter than the fourth portion length 21dy at a portion of the portion between the third portion 21c and the fourth portion 21d. In such a case as well, the width of the conductive layer 21 is longer than the third portion length 21cy at another portion of the portion between the third portion 21c and the fourth portion 21d. Thereby, the resistance of the entire conductive layer 21 can be low.

The position of the center in the Y-axis direction of the stacked body SB0 may be shifted with respect to the position of the center in the Y-axis direction of the conductive layer 21 as in the magnetic memory devices 111l and 111n. The change of the width of the conductive layer 21 may be different between the +Y axis direction and the −Y axis direction as in the magnetic memory devices 111m and 111n.

Figure 9A:
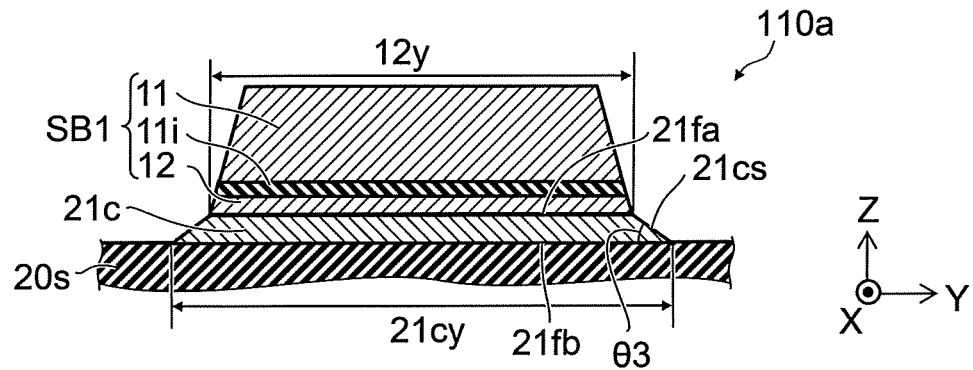
FIG. 9A to FIG. 9C are schematic cross-sectional views illustrating another magnetic memory device according to the first embodiment.
Figure 9B:
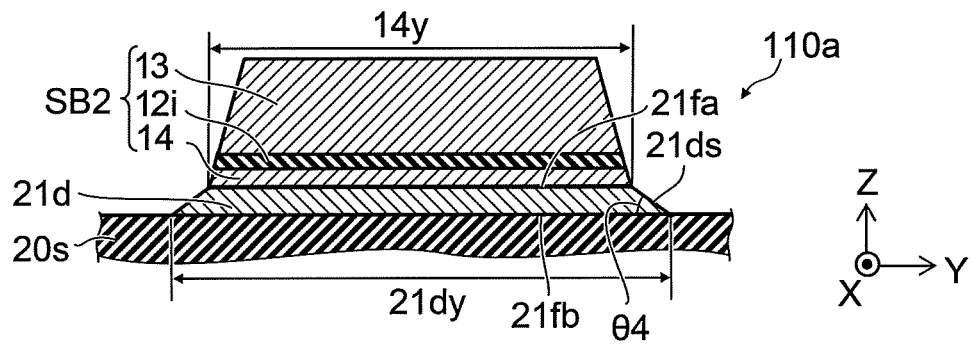
Figure 9C:
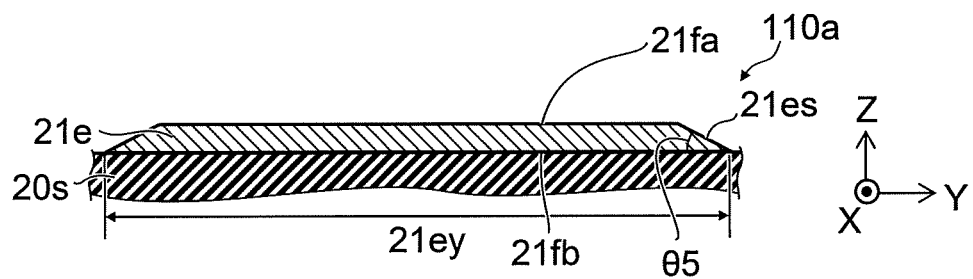

FIG. 9A to FIG. 9C are schematic cross-sectional views illustrating another magnetic memory device according to the first embodiment.

FIG. 9A is a cross-sectional view corresponding to line A1-A2 of FIG. 1A. FIG. 9B is a cross-sectional view corresponding to line B1-B2 of FIG. 1A. FIG. 9C is a cross-sectional view corresponding to line C1-C2 of FIG. 1A.

In the other magnetic memory device 110a according to the embodiment as shown in FIG. 9A to FIG. 9C, a tilt (a taper) is provided in the side surface of the conductive layer 21. In the example, the taper of the fifth portion 21e is more gradual than the tapers of the third portion 21c and the fourth portion 21d.

For example, as shown in FIG. 9A, the third portion 21c has the third portion side surface 21cs. The third portion side surface 21cs is aligned with the second direction (e.g., the X-axis direction). As shown in FIG. 9B, the fourth portion 21d has a fourth portion side surface 21ds. The fourth portion side surface 21ds is aligned with the second direction (e.g., the X-axis direction). As shown in FIG. 9C, the fifth portion 21e has the fifth portion side surface 21es. The fifth portion side surface 21es is aligned with the second direction (e.g., the X-axis direction).

A plane that is parallel to the second direction (e.g., the X-axis direction) and the third direction (e.g., the Y-axis direction) is taken as the X-Y plane (a second plane).

A taper angle θ3 of the third portion side surface 21cs is the angle between the X-Y plane and the third portion side surface 21cs. A taper angle θ4 of the fourth portion side surface 21ds is the angle between the X-Y plane and the fourth portion side surface 21ds. A taper angle θ5 of the fifth portion side surface 21es is the angle between the X-Y plane and the fifth portion side surface 21es. For example, the taper angle θ5 is smaller than the taper angle θ3. For example, the taper angle θ5 is smaller than the taper angle θ4.

For example, by providing the difference of the taper angles, it is easy to increase the difference between the fifth portion length 21ey and the third portion length 21cy. It is easy to increase the difference between the fifth portion length 21ey and the fourth portion length 21dy.

FIG. 10A to FIG. 10D are schematic views illustrating another magnetic memory device according to the first embodiment.

Figure 10A:
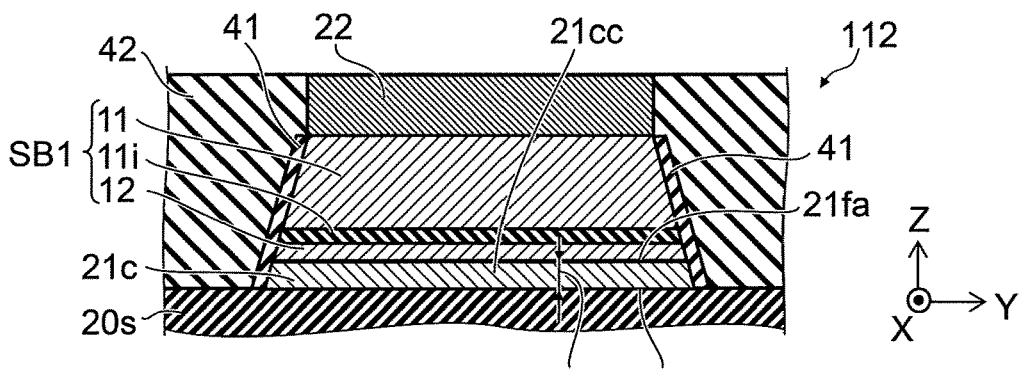
FIG. 10A to FIG. 10D are schematic views illustrating another magnetic memory device according to the first embodiment.
Figure 10B:
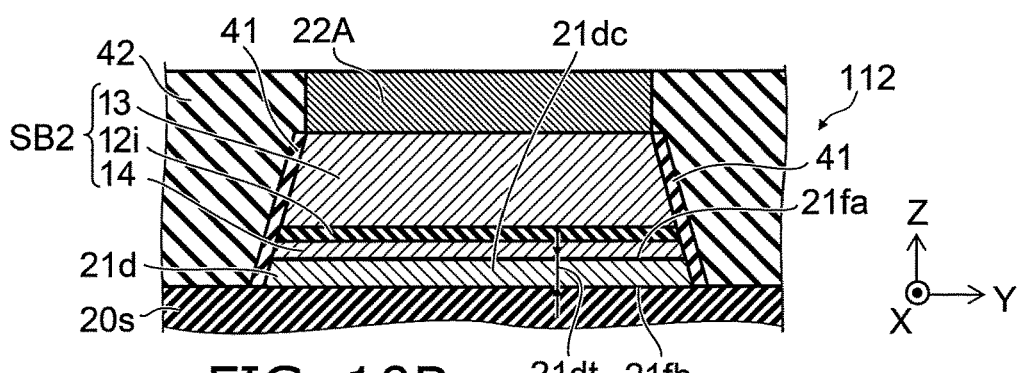
Figure 10C:
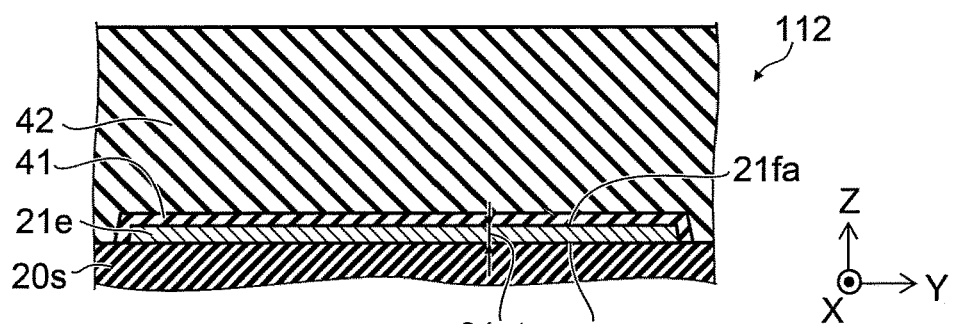
Figure 10D:
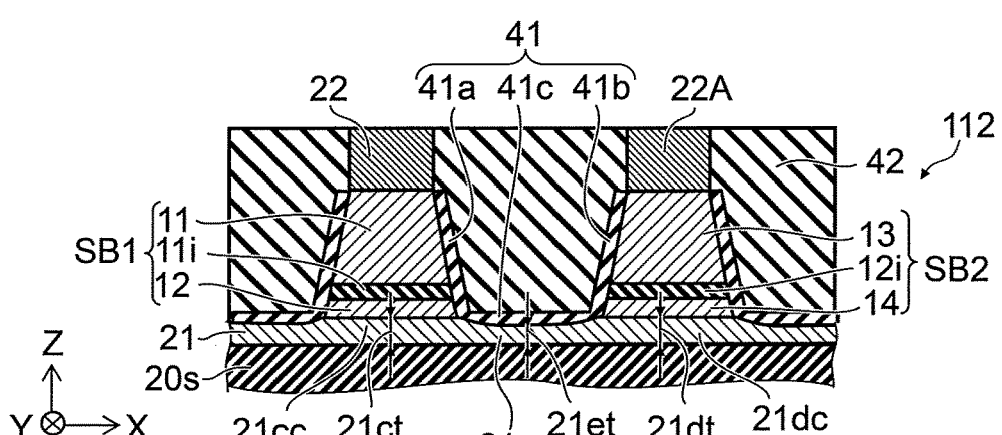

FIG. 10A is a cross-sectional view corresponding to line A1-A2 of FIG. 1A. FIG. 10B is a cross-sectional view corresponding to line B1-B2 of FIG. 1A. FIG. 10C is a cross-sectional view corresponding to line C1-C2 of FIG. 1A. FIG. 10D is a cross-sectional view corresponding to line D1-D2 of FIG. 1A.

As shown in these drawings, a first insulating portion 41 and a second insulating portion 42 are provided in the magnetic memory device 112 according to the embodiment. The thickness of the fifth portion 21e is thinner than the thickness of the third portion 21c and thinner than the thickness of the fourth portion 21d. Otherwise, the configuration of the magnetic memory device 112 is similar to that of the magnetic memory device 110; and a description is therefore omitted.

As shown in FIG. 10A and FIG. 10D, the third portion 21c includes a third portion overlap region 21cc. The third portion overlap region 21cc overlaps the second magnetic layer 12 in the first direction (the Z-axis direction). The third portion overlap region 21cc has a thickness 21ct along the first direction (the Z-axis direction).

As shown in FIG. 10B and FIG. 10D, the fourth portion 21d includes a fourth portion overlap region 21dc. The fourth portion overlap region 21dc overlaps the fourth magnetic layer 14 in the first direction (the Z-axis direction). The fourth portion overlap region 21dc has a thickness 21dt along the first direction (the Z-axis direction).

As shown in FIG. 10C and FIG. 10D, the fifth portion 21e has a fifth portion thickness 21et along the first direction (the Z-axis direction). The fifth portion thickness 21et is thinner than the thickness 21ct of the third portion overlap region 21cc. The fifth portion thickness 21et is thinner than the thickness 21dt of the fourth portion overlap region 21dc.

Thus, the thickness of the conductive layer 21 at the portions where the magnetic layers are not provided is thinner than the thickness of the conductive layer 21 at the portions where the magnetic layers are provided. For example, the stacked bodies SB0 are formed by patterning a stacked film used to form the stacked bodies SB0. In the patterning, there are cases where a portion of the film used to form the conductive layer 21 is removed. For example, the difference of the thicknesses recited above occurs thereby.

In the embodiment, the width (the fifth portion length 21ey) of the thin portion (the fifth portion 21e) of the conductive layer 21 is set to be wider than the widths of the other portions. Thereby, the increase of the resistance at the thin portion can be suppressed effectively.

As shown in FIG. 10C, at least a portion of the first insulating portion 41 is between the fifth portion 21e and the second insulating portion 42. The first insulating portion 41 has at least one of a first thermal conductivity higher than a second thermal conductivity of the second insulating portion 42 or a first specific heat higher than a second specific heat of the second insulating portion 42. By such a configuration, for example, the heat of the fifth portion 21e can be dissipated efficiently via the first insulating portion 41.

The first insulating portion 41 includes, for example, at least one selected from the group consisting of a first compound, a second compound, carbon, and silicon carbide. The first compound includes an oxide of at least one selected from the group consisting of aluminum, beryllium, yttrium, magnesium, and boron. The second compound includes a nitride of at least one selected from the group consisting of aluminum, beryllium, yttrium, magnesium, and boron. By using such materials, efficient heat dissipation by the first insulating portion 41 is obtained.

On the other hand, the second insulating portion 42 includes at least one selected from the group consisting of silicon oxide and silicon nitride. By using such materials, high insulative properties are obtained. For example, high reliability is obtained.

In the example as shown in FIG. 10A and FIG. 10D, the first insulating portion 41 is provided between the second insulating portion 42 and the first magnetic layer 11, between the second insulating portion 42 and the second magnetic layer 12, and between the second insulating portion 42 and the first intermediate layer 11i. For example, the heat of the first stacked body SB1 is dissipated efficiently via the first insulating portion 41.

Similarly, as shown in FIG. 10B and FIG. 10D, the first insulating portion 41 is provided between the second insulating portion 42 and the third magnetic layer 13, between the second insulating portion 42 and the fourth magnetic layer 14, and between the second insulating portion 42 and the second intermediate layer 12i. For example, the heat of the second stacked body SB2 is dissipated efficiently via the first insulating portion 41.

As shown in FIG. 10D, the first insulating portion 41 includes a first insulating region 41a and a second insulating region 41b. In the second direction (the X-axis direction), the first insulating region 41a is between the group of the first magnetic layer 11, the second magnetic layer 12, and the first intermediate layer 11i and the group of the third magnetic layer 13, the fourth magnetic layer 14, and the second intermediate layer 12i. In the second direction, the second insulating region 41b is between the first insulating region 41a and the third magnetic layer 13, between the first insulating region 41a and the fourth magnetic layer 14, and between the first insulating region 41a and the second intermediate layer 12i. At least a portion of the second insulating portion 42 is between the first insulating region 41a and the second insulating region 41b in the second direction.

As shown in FIG. 10C and FIG. 10D, at least a portion of the first insulating portion 41 (e.g., a third insulating region 41c) is positioned between the fifth portion 21e and at least a portion of the second insulating portion 42 in the first direction (the Z-axis direction).

As shown in FIG. 10C, at least a portion of the first insulating portion 41 is positioned between the fifth portion 21e and at least a portion of the second insulating portion 42 in the third direction (the Y-axis direction).

Figure 11:
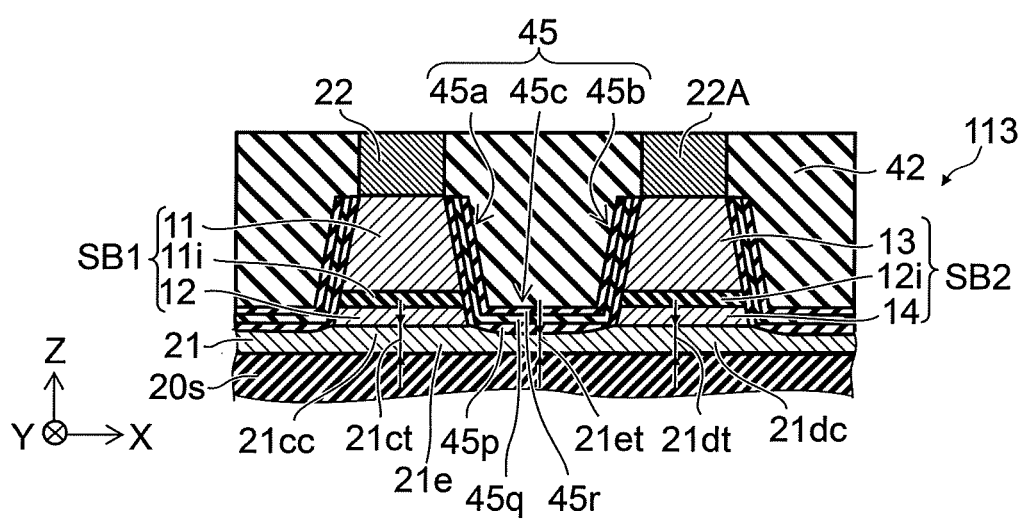
FIG. 11 is a schematic view illustrating another magnetic memory device according to the first embodiment.

FIG. 11 is a schematic view illustrating another magnetic memory device according to the first embodiment.

As shown in FIG. 11, a stacked insulating portion 45 and the second insulating portion 42 are provided in the magnetic memory device 113 according to the embodiment. Otherwise, the configuration of the magnetic memory device 113 is similar to that of the magnetic memory device 112; and a description is therefore omitted.

The stacked insulating portion 45 includes a first stacked insulating region 45a and a second stacked insulating region 45b. In the second direction (the X-axis direction), the first stacked insulating region 45a between the first magnetic layer 11 and the third magnetic layer 13, between the second magnetic layer 12 and the fourth magnetic layer 14, and between the first intermediate layer 11i and the second intermediate layer 12i. In the second direction, the second stacked insulating region 45b is between the first stacked insulating region 45a and the third magnetic layer 13, between the first stacked insulating region 45a and the fourth magnetic layer 14, and between the first stacked insulating region 45a and the second intermediate layer 12i. At least a portion of the second insulating portion 42 is between the first stacked insulating region 45a and the second stacked insulating region 45b in the second direction.

In the first direction (the Z-axis direction), at least a portion of the stacked insulating portion 45 (e.g., a third stacked insulating region 45c) is positioned between the fifth portion 21e and at least a portion of the second insulating portion 42.

The stacked insulating portion 45 includes, for example, a first layer 45p, a second layer 45q, and a third layer 45r. For example, the second layer 45q is provided between the third layer 45r and the fifth portion 21e (the conductive layer 21) in the first direction. The first layer 45p is provided between the second layer 45q and the fifth portion 21e (the conductive layer 21) in the first direction. For example, the first layer 45p contacts the conductive layer 21.

For example, the concentration of oxygen of the first layer 45p is lower than the concentration of oxygen of the second layer 45q. For example, the concentration of oxygen of the first layer 45p is lower than the concentration of oxygen of the third layer 45r. By providing the first layer 45p having the low oxygen concentration on the conductive layer 21 side, for example, the oxidization of the conductive layer 21 is suppressed. Thereby, a low electrical resistance can be maintained.

The etching rate of the third layer 45r is higher than the etching rate of the second layer 45q. By using the third layer 45r having the high etching rate, for example, the conductive layer 21 can be patterned easily into the desired configuration in the patterning of the conductive film used to form the conductive layer 21 and the stacked film used to form the stacked bodies (the first stacked body SB1, the second stacked body SB2, etc.). The patterning speed of the patterning by etching can be adjusted.

The first layer 45p includes, for example, silicon nitride. The second layer 45q includes, for example, aluminum oxide. The third layer 45r includes, for example, silicon oxide, silicon nitride, or silicon oxynitride. By using the stacked insulating portion 45 including the multiple films, high insulative properties are obtained.

Examples of the configuration of the cross section of the fifth portion 21e will now be described.

FIG. 12A to FIG. 12G and FIG. 13A to FIG. 13D are schematic cross-sectional views illustrating a portion of the magnetic memory device according to the first embodiment.

These drawings illustrate the cross section when the fifth portion 21e is cut by the Z-Y plane.

Figure 12A:
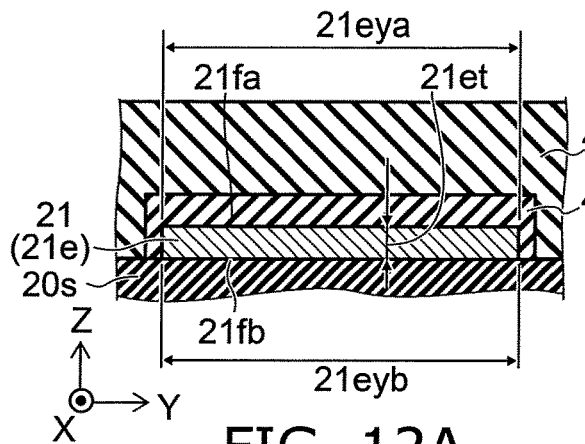
FIG. 12A to FIG. 12G are schematic cross-sectional views illustrating a portion of the magnetic memory device according to the first embodiment.
Figure 12B:
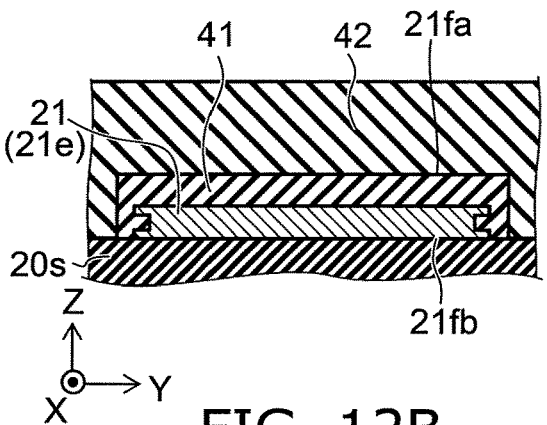
Figure 12C:
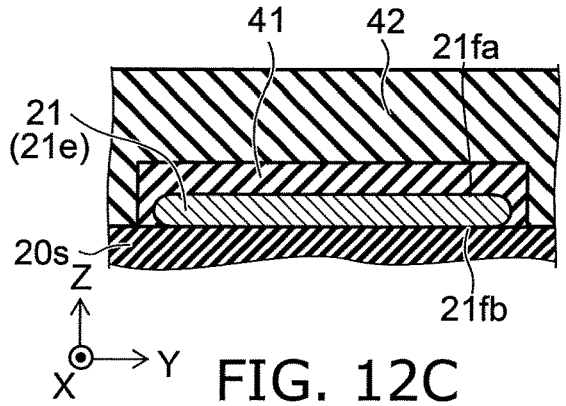
Figure 12D:
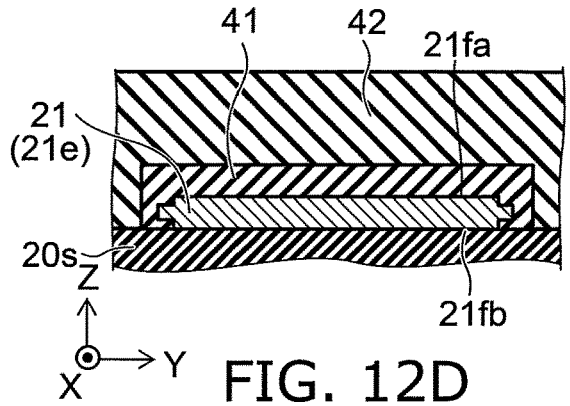

In the example shown in FIG. 12A, the cross section of the fifth portion 21e is substantially a rectangle. The conductive layer 21 has the first surface 21fa and the second surface 21fb. The first surface 21fa is, for example, the upper surface. The second surface 21fb is the lower surface. As described above, the first surface 21fa is positioned between the second surface 21fb and the second magnetic layer 12 at the third portion 21c (referring to FIG. 1B).

The length of the first surface 21fa at the cross section of the fifth portion 21e in the Z-Y plane (a first plane perpendicular to the second direction) is a first line segment length 21eya. The length of the second surface 21fb in the cross section of the fifth portion 21e in the Z-Y plane is a second line segment length 21eyb.

In the example of FIG. 12A, the length of the outer edge of the fifth portion 21e in the cross section is substantially the sum of the first line segment length 21eya, the second line segment length 21eyb, and 2 times the fifth portion thickness 21et.

In the examples shown in FIG. 12B to FIG. 12G, the cross section of the fifth portion 21e is not a rectangle. In these examples, the length of the outer edge of the cross section is longer than the sum recited above. For example, in these examples, the length of the outer edge of the fifth portion 21e in the cross section of the fifth portion 21e in the first plane (the Z-Y plane) perpendicular to the second direction (the X-axis direction) is longer than the sum of the first line segment length 21eya, the second line segment length 21eyb, and 2 times the fifth portion thickness 21et (the length along the first direction (the Z-axis direction) of the fifth portion 21e). In such cases, compared to the case where the cross section is a rectangle, the length of the outer edge in the cross section of the fifth portion 21e is long. Thereby, good heat dissipation is obtained at the fifth portion 21e.

In the examples of FIG. 12B, FIG. 12C, FIG. 12D, and FIG. 12G, the surface of the fifth portion 21e includes at least one of a recess or a protrusion. In these examples, the surface is the side surface of the fifth portion 21e. The side surface is aligned with the second direction. For example, the depth of the recess is not less than 0.1 times the fifth portion thickness 21et (the thickness along the first direction of the fifth portion 21e). For example, the height of the protrusion is not less than 0.1 times the fifth portion thickness 21et.

Figure 12E:
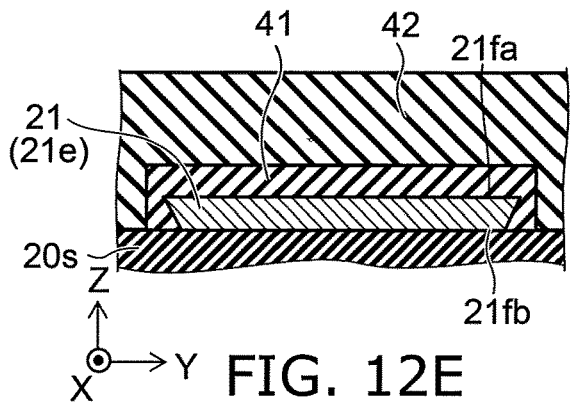
Figure 12F:
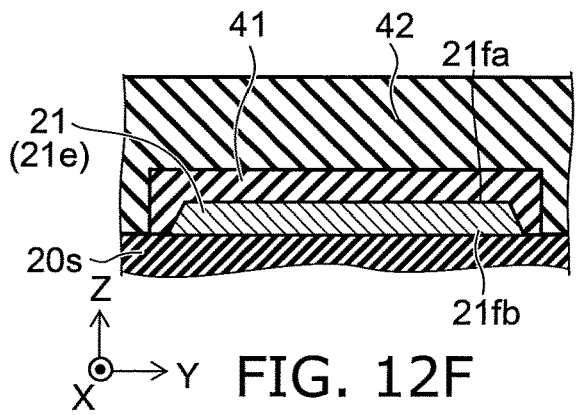
Figure 12G:
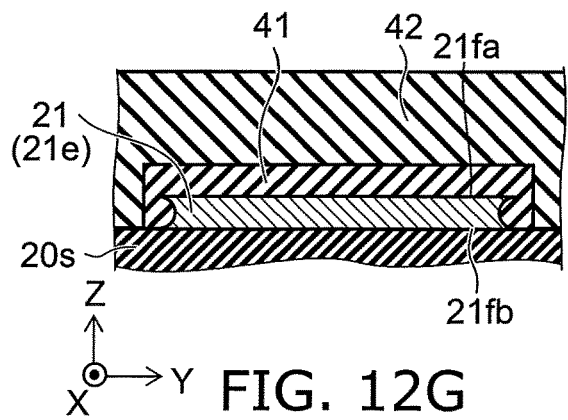
Figure 13A:
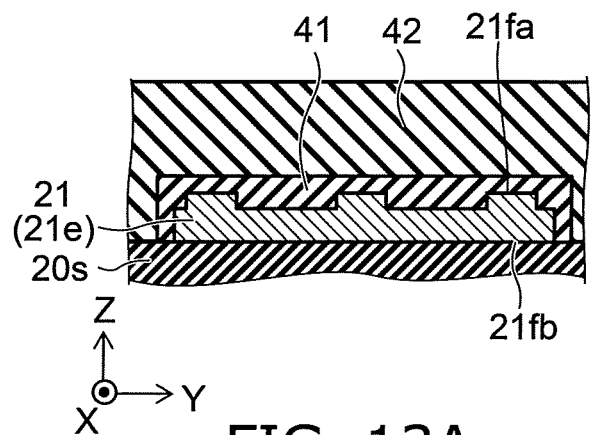
FIG. 13A to FIG. 13D are schematic cross-sectional views illustrating a portion of the magnetic memory device according to the first embodiment.
Figure 13B:
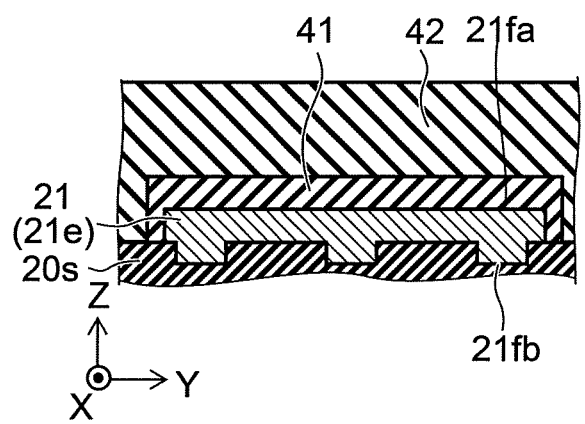
Figure 13C:
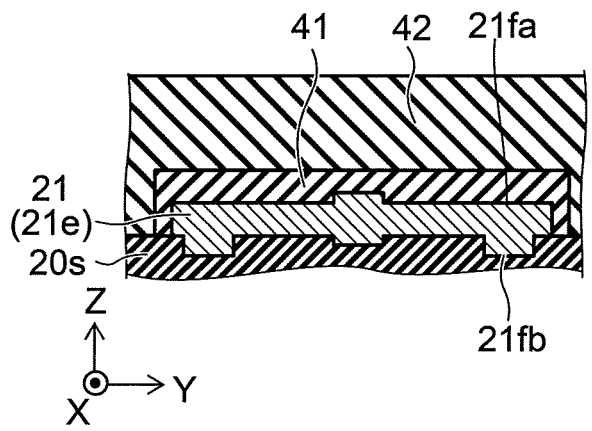
Figure 13D:
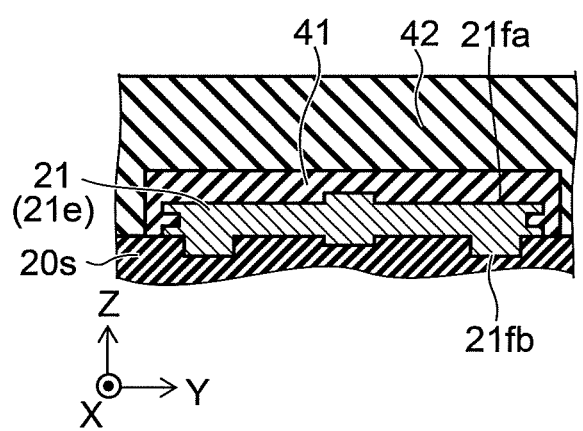

In the examples shown in FIG. 12E and FIG. 12F, the side surface of the fifth portion 21e is tilted with respect to the Z-axis direction.

In the examples shown in FIG. 13A to FIG. 13D as well, the length of the outer edge of the fifth portion 21e in the cross section of the fifth portion 21e in the Z-Y plane is longer than the sum of the first line segment length 21eya, the second line segment length 21eyb, and 2 times the fifth portion thickness 21et. In these examples, the surface of the fifth portion 21e (at least one of the first surface 21fa or the second surface 21fb) includes at least one of a recess or a protrusion. For example, the depth of the recess is not less than 0.1 times the fifth portion thickness 21et. For example, the height of the protrusion is not less than 0.1 times the fifth portion thickness 21et. Thereby, good heat dissipation is obtained in the fifth portion 21e.

Thus, various modifications of the width of the conductive layer 21 are possible in the embodiment.

In the embodiment, the center in the Y-axis direction of the stacked body SB0 and the center in the Y-axis direction of the conductive layer 21 may match or may be shifted. In the embodiment, at least one of a difference of the tapered configurations and a difference of the taper angles may be provided in the two end portions in the Y-axis direction of the conductive layer 21.

Examples of the conductive layer 21, the first magnetic layer 11, the second magnetic layer 12, and the first intermediate layer 11i will now be described. A description that relates to the conductive layer 21 recited below is applicable to the other conductive layers 21X (the conductive layer 21A, etc.). A description that relates to the first magnetic layer 11 recited below is applicable to the third magnetic layer 13. A description that relates to the second magnetic layer 12 recited below is applicable to the fourth magnetic layer 14. A description that relates to the first intermediate layer 11i recited below is applicable to the second intermediate layer 12i.

The conductive layer 21 may include, for example, a material having a high spin Hall effect. For example, the conductive layer 21 contacts the second magnetic layer 12. For example, the conductive layer 21 provides a spin-orbit torque to the second magnetic layer 12. The conductive layer 21 may function as, for example, a Spin Orbit Layer (SOL). For example, the orientation of the second magnetization 12M of the second magnetic layer 12 can be changed by the spin-orbit torque generated between the conductive layer 21 and the second magnetic layer 12. For example, the direction of the second magnetization 12M can be controlled according to the orientation of the current (the program current) (the orientation of the first current Iw1 or the orientation of the second current Iw2) flowing through the conductive layer 21.

The conductive layer 21 includes, for example, at least one selected from the group consisting of tantalum and tungsten. The conductive layer 21 includes, for example, at least one selected from the group consisting of β-tantalum and β-tungsten. The spin Hall angle is negative for these materials. The absolute value of the spin Hall angle is large for these materials. Thereby, the second magnetization 12M can be controlled efficiently by the program current.

The conductive layer 21 may include at least one selected from the group consisting of platinum and gold. The spin Hall angle is positive for these materials. The absolute value of the spin Hall angle is large for these materials. Thereby, the second magnetization 12M can be controlled efficiently by the program current.

The direction (the orientation) of the spin-orbit torque applied to the second magnetic layer 12 is different according to the polarity of the spin Hall angle. For example, the conductive layer 21 provides a spin-orbit interaction torque to the second magnetic layer 12.

The second magnetic layer 12 is, for example, a free magnetic layer. The second magnetic layer 12 includes, for example, at least one of a ferromagnetic material or a soft magnetic material. The second magnetic layer 12 may include, for example, an artificial lattice.

The second magnetic layer 12 includes, for example, at least one selected from the group consisting of FePd (iron-palladium), FePt (iron-platinum), CoPd (cobalt-palladium), and CoPt (cobalt-platinum). The soft magnetic materials recited above include, for example, CoFeB (cobalt-iron-boron). The artificial lattices recited above include, for example, a stacked film including a first film and a second film. The first film includes, for example, at least one of NiFe (nickel-iron), Fe (iron), or Co (cobalt). The second film includes, for example, at least one of Cu (copper), Pd (palladium), or Pt (platinum). The first film is, for example, a magnetic material; and the second film is a nonmagnetic material.

The second magnetic layer 12 may include, for example, a ferrimagnetic material.

In the embodiment, for example, the second magnetic layer 12 has in-plane magnetic anisotropy. Thereby, for example, a polarized spin that is antiparallel to the magnetization direction from the conductive layer 21 can be obtained. For example, the second magnetic layer 12 may have at least one of shape magnetic anisotropy in the plane, magneto-crystalline anisotropy in the plane, or induced magnetic anisotropy in the plane due to the stress or the like.

The first intermediate layer 11i includes, for example, at least one selected from the group consisting of MgO (magnesium oxide), CaO (calcium oxide), SrO (strontium oxide), TiO (titanium oxide), VO (vanadium oxide), NbO (niobium oxide), and $Al_2O_3$ (aluminum oxide). The first intermediate layer 11i is, for example, a tunneling barrier layer. In the case where the first intermediate layer 11i includes MgO, the thickness of the first intermediate layer 11i is, for example, about 1 nm.

The first magnetic layer 11 is, for example, a reference layer. The first magnetic layer 11 is, for example, a fixed magnetic layer. The first magnetic layer 11 includes, for example, Co (cobalt) and CoFeB (cobalt-iron-boron). The first magnetization 11M of the first magnetic layer 11 is fixed in substantially one direction (a direction crossing the Z-axis direction) in the plane. The first magnetic layer 11 is, for example, an in-plane magnetization film.

For example, the thickness of the first magnetic layer 11 (the reference layer) is thicker than the thickness of the second magnetic layer 12 (the free layer). Thereby, the first magnetization 11M of the first magnetic layer 11 is fixed stably in the prescribed direction.

In the embodiment, for example, the base body 20s is aluminum oxide. The conductive layer 21 is a Ta layer (having a thickness of, for example, not less than 3 nm and not more than 10 nm). The second magnetic layer 12 includes, for example, a CoFeB layer (having a thickness of, for example, not less than 1.5 nm and not more than 2.5 nm). The first intermediate layer 11i includes a MgO layer (having a thickness of, for example, not less than 0.8 nm and not more than 1.2 nm).

The first magnetic layer 11 may include, for example, first to third films. The first film is provided between the third film and the first intermediate layer 11i. The second film is provided between the first film and the third film. The first film includes, for example, a CoFeB film (having a thickness of, for example, not less than 1.5 nm and not more than 2.5 nm). The second film includes, for example, a Ru film (having a thickness of, for example, not less than 0.7 nm and not more than 0.9 nm). The third film includes, for example, a CoFeB film (having a thickness of, for example, not less than 1.5 nm and not more than 2.5 nm).

For example, a ferromagnetic layer may be provided. The first magnetic layer 11 is provided between the ferromagnetic layer and the first intermediate layer 11i. The ferromagnetic layer is, for example, an IrMn-layer (having a thickness of not less than 7 nm and not more than 9 nm). The ferromagnetic layer fixes the first magnetization 11M of the first magnetic layer 11. A Ta layer may be provided on the ferromagnetic layer.

An example of operations of the magnetic memory device according to the embodiment will now be described.

As described above, the controller 70 is electrically connected to the first stacked body SB1 (the first magnetic layer 11) and the second stacked body SB2 (the third magnetic layer 13). A prescribed select voltage is applied to the first magnetic layer 11 when the information is programmed to the first stacked body SB1. In such a case, an unselect voltage is applied to the second stacked body SB2. On the other hand, the prescribed select voltage is applied to the third magnetic layer 13 when the information is programmed to the second stacked body SB2. In such a case, the unselect voltage is applied to the first stacked body SB1. The application of a voltage of 0 volts also is included in "a voltage being applied." The potential of the select voltage is different from the potential of the unselect voltage.

For example, in the first program operation, the controller 70 sets the first magnetic layer 11 to a potential (e.g., a select potential) that is different from the potential of the third magnetic layer 13 (e.g., an unselect potential). In the second program operation, the controller 70 sets the first magnetic layer 11 to a potential (e.g., the select potential) that is different from the potential of the third magnetic layer 13 (e.g., the unselect potential).

For example, in a third program operation, the controller 70 sets the third magnetic layer 13 to a potential (e.g., the select potential) that is different from the potential of the first magnetic layer 11 (e.g., the unselect potential). In a fourth program operation, the controller 70 sets the third magnetic layer 13 to a potential (e.g., the select potential) that is different from the potential of the first magnetic layer 11 (e.g., the unselect potential).

For example, the selection of such potentials is performed by the operations of the first switch element Sw1 and the second switch element Sw2.

An example of such operations will now be described.

FIG. 14A to FIG. 14D are schematic views illustrating another magnetic memory device according to the first embodiment.

Figure 14A:
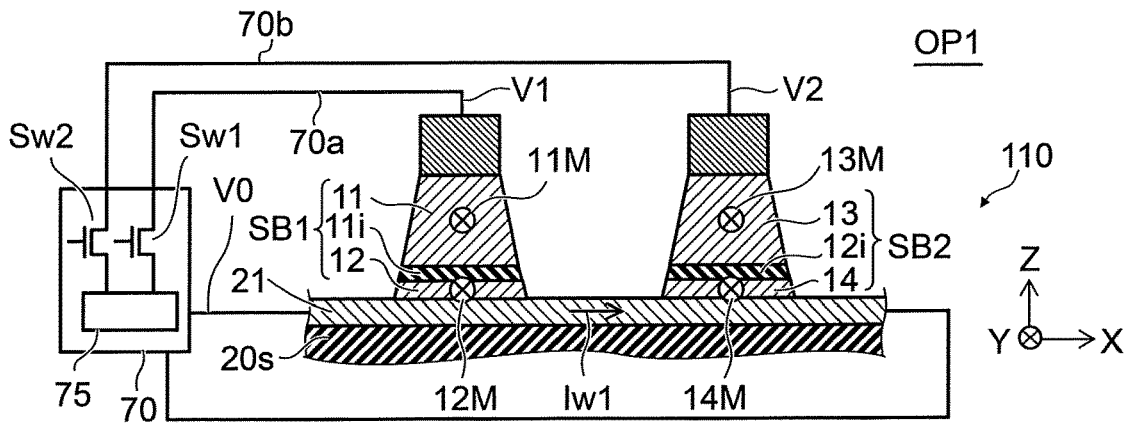
FIG. 14A to FIG. 14D are schematic views illustrating another magnetic memory device according to the first embodiment.

As shown in FIG. 14A, the controller 70 and the first magnetic layer 11 are electrically connected by a first interconnect 70a. The controller 70 and the third magnetic layer 13 are electrically connected by a second interconnect 70b. In the example, the first switch element Sw1 is provided on the first interconnect 70a. The second switch element Sw2 is provided on the second interconnect 70b. The controller 70 controls the potential of the first magnetic layer 11 by controlling the potential of the first interconnect 70a. The change of the potential of the first interconnect 70a is substantially small. Therefore, the potential of the first interconnect 70a can be considered to be the potential of the first magnetic layer 11. Similarly, the potential of the second interconnect 70b can be considered to be the potential of the third magnetic layer 13. Hereinbelow, the potential of the first magnetic layer 11 is taken to be the same as the potential of the first interconnect 70a. Hereinbelow, the potential of the third magnetic layer 13 is taken to be the same as the potential of the second interconnect 70b.

In the following example, the first magnetization 11M of the first magnetic layer 11 and the third magnetization 13M of the third magnetic layer 13 are in the +Y direction. These magnetizations are fixed.

In a first operation OP1 as shown in FIG. 14A, the controller 70 sets the first portion 21a of the conductive layer 21 to a potential V0. The potential V0 is, for example, the ground potential. In the first operation OP1, the controller 70 sets the first magnetic layer 11 to a first voltage V1. Namely, in the first operation OP1, the controller 70 sets the first potential difference between the first portion 21a and the first magnetic layer 11 to the first voltage V1. The first voltage V1 is, for example, the select voltage.

On the other hand, in the first operation OP1, the controller 70 sets the third magnetic layer 13 to a second voltage V2. Namely, in the first operation OP1, the controller 70 sets the second potential difference between the first portion 21a and the third magnetic layer 13 to the second voltage V2. The second voltage V2 is, for example, the unselect voltage. The second voltage V2 is different from the first voltage V1. For example, the absolute value of the first voltage V1 is greater than the absolute value of the second voltage V2. For example, the polarity of the first voltage V1 is different from the polarity of the second voltage V2.

In the first operation OP1, the controller 70 supplies the first current Iw1 to the conductive layer 21. The first current Iw1 has an orientation from the first portion 21a toward the second portion 21b.

In such a first operation OP1, for example, the second magnetization 12M of the second magnetic layer 12 in the selected state is oriented in, for example, the +Y direction. This is due to the magnetic effect from the conductive layer 21. On the other hand, the fourth magnetization 14M of the fourth magnetic layer 14 in the unselected state substantially does not change. In the example, the fourth magnetization 14M is maintained in the initial state (in the example, the +Y direction).

Figure 14B:
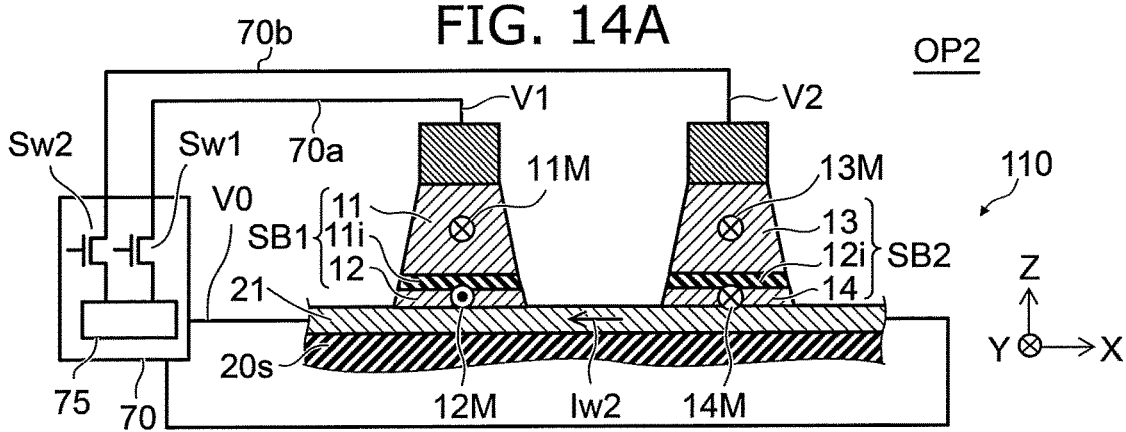

In a second operation OP2 as shown in FIG. 14B, the controller 70 sets the first portion 21a of the conductive layer 21 to the potential V0. In the second operation OP2, the controller 70 sets the first potential difference between the first portion 21a and the first magnetic layer 11 to the first voltage V1. In the second operation OP2, the controller 70 sets the second potential difference between the first portion 21a and the third magnetic layer 13 to the second voltage V2. In the second operation OP2, the controller 70 supplies the second current Iw2 to the conductive layer 21. The second current Iw2 has an orientation from the second portion 21b toward the first portion 21a.

At this time, the second magnetization 12M of the second magnetic layer 12 in the selected state changes to be in, for example, the −Y direction. This is due to the magnetic effect from the conductive layer 21. On the other hand, the fourth magnetization 14M of the fourth magnetic layer 14 in the unselected state substantially does not change. In the example, the fourth magnetization 14M is maintained in the initial state (in the example, the +Y direction).

The electrical resistance between the first magnetic layer 11 and the first portion 21a after the first operation OP1 is taken as the first electrical resistance. The electrical resistance between the first magnetic layer 11 and the first portion 21a after the second operation OP2 is taken as the second electrical resistance. The first electrical resistance is different from the second electrical resistance. In the example, the first electrical resistance is lower than the second electrical resistance.

On the other hand, the electrical resistance between the third magnetic layer 13 and the first portion 21a after the first operation OP1 recited above is taken as the third electrical resistance. The electrical resistance between the third magnetic layer 13 and the first portion 21a after the second operation OP2 recited above is taken as the fourth electrical resistance. The third electrical resistance is substantially the same as the fourth electrical resistance. This is because the fourth magnetization 14M of the fourth magnetic layer 14 substantially does not change.

Thus, in the embodiment, the absolute value of the difference between the first electrical resistance and the second electrical resistance is greater than the absolute value of the difference between the third electrical resistance and the fourth electrical resistance.

Thus, in the first stacked body SB1 in the selected state, the change of the electrical resistance is formed by the first current Iw1 or the second current Iw2. In other words, the programming of the information is performed. On the other hand, in the second stacked body SB2 in the unselected state, the change of the electrical resistance due to the first current Iw1 or the second current Iw2 is not formed.

Figure 14C:
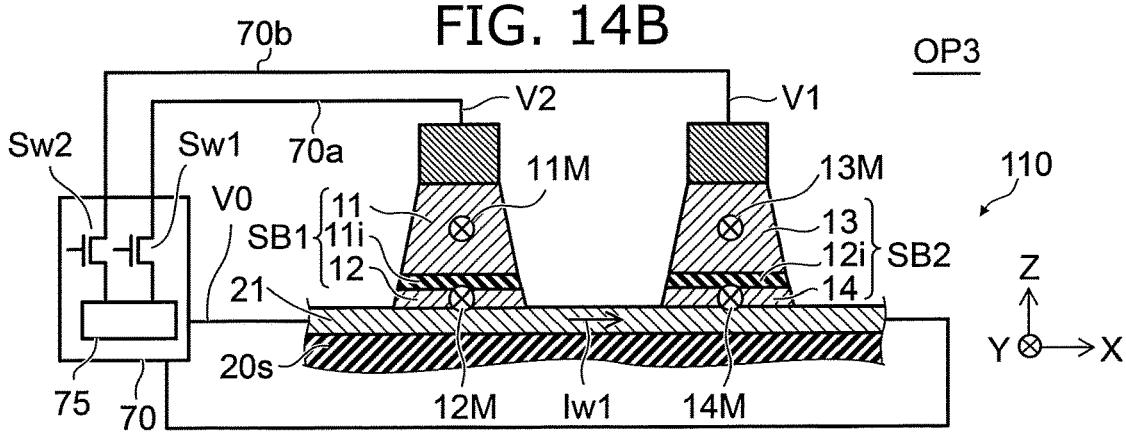

In the example of a third operation OP3 shown in FIG. 14C, the first stacked body SB1 is set to the unselected state; and the second stacked body SB2 is set to the selected state. In such a case, in the first operation OP1, the controller 70 sets the first potential difference between the first portion 21a and the first magnetic layer 11 to the first voltage V1 (referring to FIG. 14A). On the other hand, in the second operation OP2, the controller 70 sets the first potential difference to the first voltage V1 (referring to FIG. 14B). In the third operation OP3 as shown in FIG. 14C, the controller 70 sets the first potential difference between the first portion 21a and the first magnetic layer 11 to the second voltage V2 (the unselect voltage). In the third operation OP3, the controller 70 supplies the first current Iw1 to the conductive layer 21.

At this time, the second magnetization 12M of the second magnetic layer 12 in the unselected state is the same as the state of FIG. 14A. On the other hand, the fourth magnetization 14M of the fourth magnetic layer 14 in the selected state changes from the state of FIG. 14A.

Figure 14D:
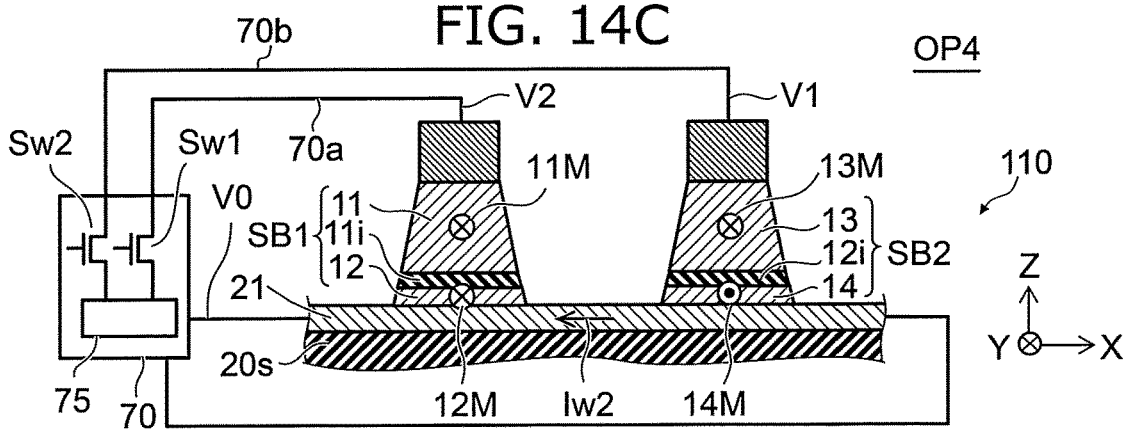

In a fourth operation OP4 shown in FIG. 14D as well, the first stacked body SB1 is set to the unselected state; and the second stacked body SB2 is set to the selected state. In the fourth operation OP4, the controller 70 sets the first potential difference to the second voltage V2. In the fourth operation OP4, the controller 70 supplies the second current Iw2 to the conductive layer 21.

In the first stacked body SB1 which is in the unselected state, the electrical resistance is substantially the same between the third operation OP3 and the fourth operation OP4. On the other hand, in the second stacked body SB2 which is in the selected state, the electrical resistance changes between the third operation OP3 and the fourth operation OP4.

Thus, the absolute value of the difference between the first electrical resistance after the first operation OP1 and the second electrical resistance after the second operation OP2 is greater than the absolute value of the difference between the electrical resistance between the first magnetic layer 11 and the first portion 21a after the third operation OP3 and the electrical resistance between the first magnetic layer 11 and the first portion 21a after the fourth operation OP4.

The multiple stacked bodies correspond respectively to multiple memory cells. It is possible to store mutually-different information in the multiple memory cells. When storing the information in the multiple memory cells, for example, one of "1" or "0" may be stored in the multiple memory cells; and subsequently, the other of "1" or "0" may be stored in some of the multiple memory cells as desired. For example, one of "1" or "0" may be stored in one of the multiple memory cells; and subsequently, one of "1" or "0" may be stored in another one of the multiple memory cells.

In the description recited above, the first portion 21a and the second portion 21b are interchangeable with each other. For example, the electrical resistance recited above may be the electrical resistance between the first magnetic layer 11 and the second portion 21b. The electrical resistance recited above may be the electrical resistance between the third magnetic layer 13 and the second portion 21b.

Second Embodiment

A second embodiment relates to a method for manufacturing the magnetic memory device according to the first embodiment.

Figure 15:
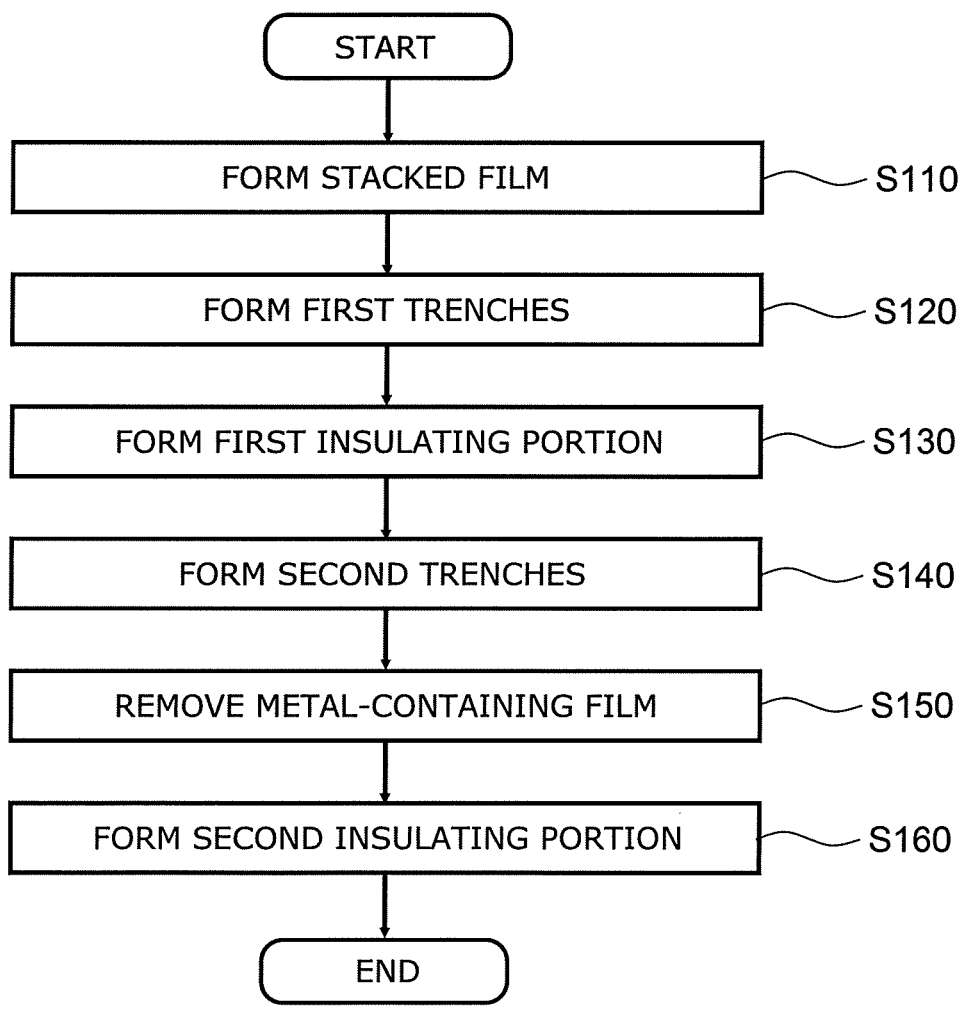
FIG. 15 is a flowchart illustrating the method for manufacturing the magnetic memory device according to the second embodiment.

FIG. 15 is a flowchart illustrating the method for manufacturing the magnetic memory device according to the second embodiment.

FIG. 16A to FIG. 16D, FIG. 17A to FIG. 17E, FIG. 18A to FIG. 18C, FIG. 19A, and FIG. 19B are schematic views illustrating the method for manufacturing the magnetic memory device according to the second embodiment.

FIG. 16A, FIG. 16C, FIG. 17D, FIG. 18A to FIG. 18C, FIG. 19A, and FIG. 19B are schematic plan views. FIG. 16B, FIG. 16D, FIG. 17A to FIG. 17C, and FIG. 17E are schematic cross-sectional views.

As shown in FIG. 15, a stacked film is formed on a conductive film provided on the base body 20s (step S110).

Figure 16A:
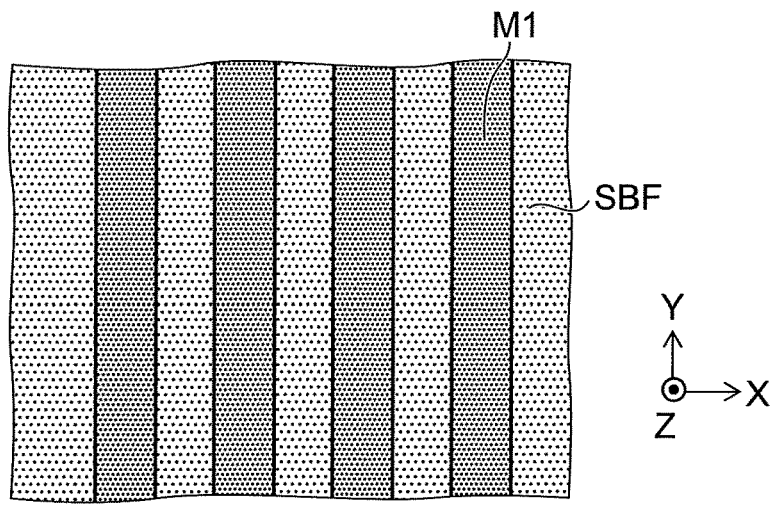
FIG. 16A to FIG. 16D are schematic views illustrating a method for manufacturing the magnetic memory device according to the second embodiment.
Figure 16B:
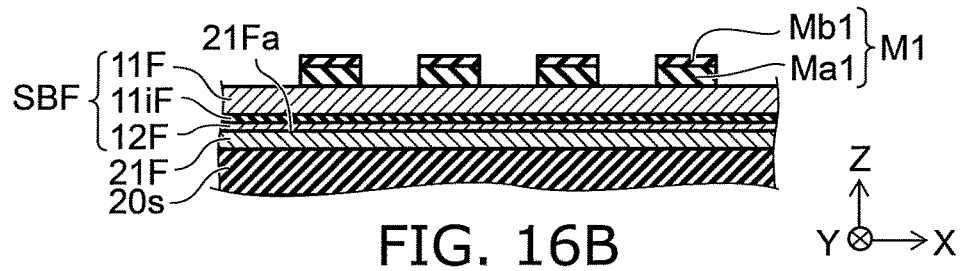

For example, as shown in FIG. 16B, a conductive film 21F (e.g., a Ta film) is provided on the base body 20s (e.g., an aluminum oxide substrate).

A direction perpendicular to a surface 21Fa of the conductive film 21F is taken as the first direction (the Z-axis direction). One direction perpendicular to the Z-axis direction is taken as the X-axis direction. A direction perpendicular to the Z-axis direction and the X-axis direction is taken as the Y-axis direction.

The conductive film 21F is used to form the conductive layer 21. A stacked film SBF is provided on the conductive film 21F. The stacked film SBF includes a first magnetic film 11F, a second magnetic film 12F, and an intermediate film 11iF. The second magnetic film 12F is provided between the first magnetic film 11F and the conductive film 21F. The intermediate film 11iF is provided between the first magnetic film 11F and the second magnetic film 12F. The intermediate film 11iF is nonmagnetic.

Further, a first mask M1 is formed on the stacked film SBF. The first mask M1 includes, for example, a tungsten film Mb1 (having a thickness of, for example, not less than 25 nm and not more than 35 nm) and a ruthenium film Mal (having a thickness of, for example, not less than 1 nm and not more than 3 nm). The ruthenium film Mal is provided between the tungsten film Mb1 and the stacked film SBF.

As shown in FIG. 16A, the first mask M1 has a configuration of multiple band configurations extending in the Y-axis direction. The stacked film SBF is exposed in the opening of the first mask M1. The first mask M1 may be formed by, for example, double patterning technology.

Figure 16C:
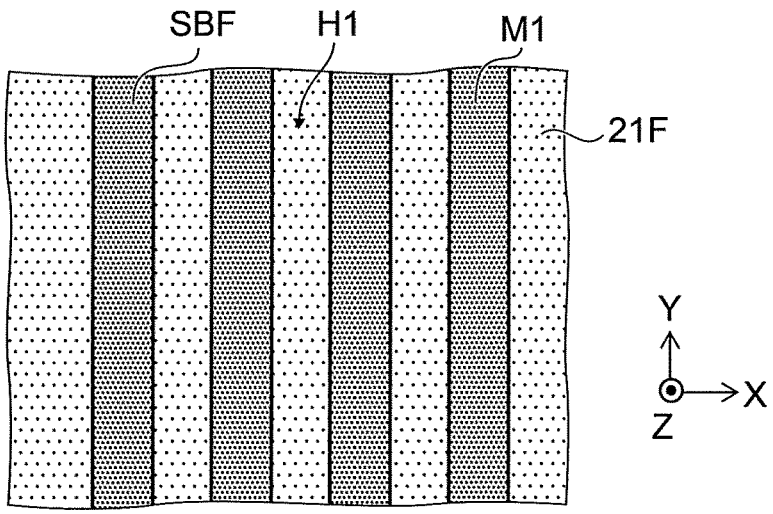
Figure 16D:
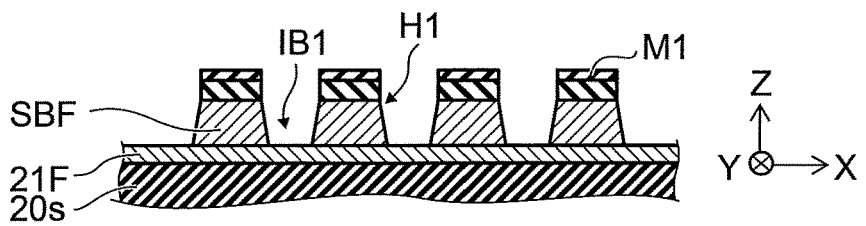

As shown in FIG. 16C and FIG. 16D, the stacked film SBF is patterned using the first mask M1. For example, an ion beam IB1 is irradiated. A portion of the stacked film SBF is removed. The conductive film 21F remains. Thereby, multiple first trenches H1 are formed. The multiple first trenches H1 arranged in the second direction (the X-axis direction) crossing the first direction. The multiple first trenches H1 extend along the third direction (in the example, the Y-axis direction). The third direction crosses the first direction and the second direction. The first trenches H1 reach the conductive film 21F. The stacked film SBF is divided by the first trenches H1.

Thus, in the manufacturing method, the multiple first trenches H1 are formed (step S120 referring to FIG. 15).

Figure 17A:
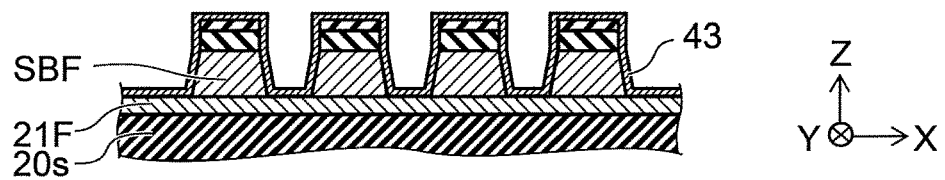
FIG. 17A to FIG. 17E are schematic views illustrating the method for manufacturing the magnetic memory device according to the second embodiment.

In the example as shown in FIG. 17A, for example, plasma processing is performed. Thereby, a compound film 43 is formed on the side wall of the stacked film SBF. The plasma processing is oxygen plasma processing or nitrogen plasma processing. For example, the compound film 43 includes a compound including an element included in the conductive film 21F. The compound film 43 is, for example, a protective film.

Figure 17B:
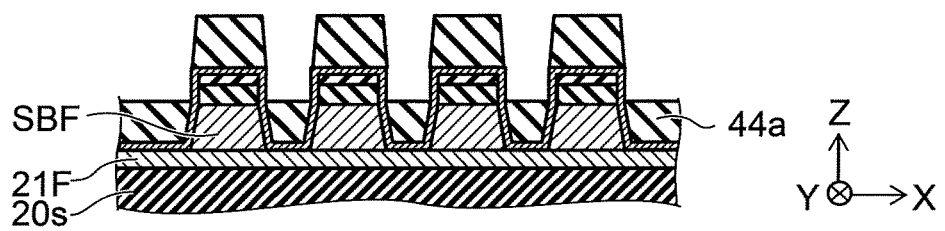

As shown in FIG. 17B, a first insulating film 44a is formed inside the first trenches H1. The first insulating film 44a is, for example, a SiN film.

Figure 17C:
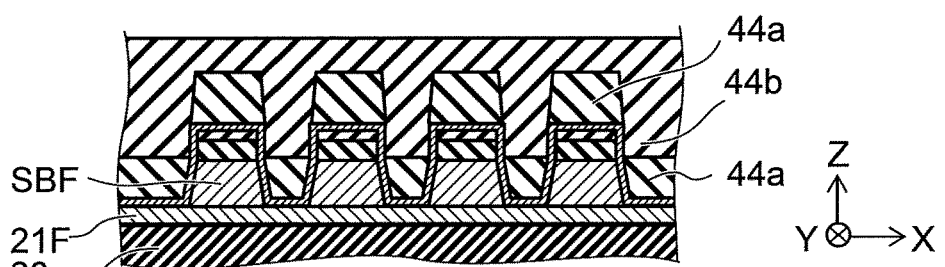

A second insulating film 44b is formed as shown in FIG. 17C. The second insulating film 44b is, for example, a stacked film including an aluminum oxide film and a silicon oxide film. Subsequently, planarization is performed.

Figure 17D:
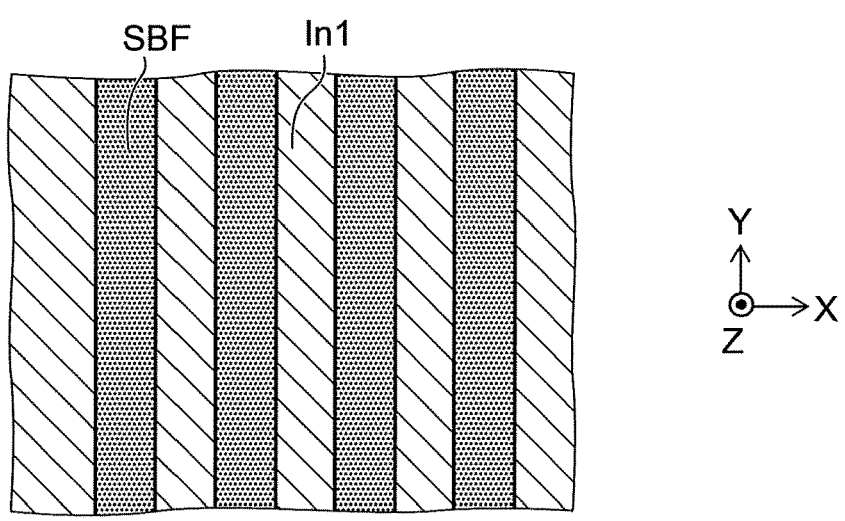
Figure 17E:

Thereby, as shown in FIG. 17D and FIG. 17E, a first insulating portion In1 is formed inside the first trenches H1. The first insulating portion In1 includes, for example, the compound film 43 recited above. The first insulating portion In1 includes the first insulating film 44a recited above. The first insulating portion In1 may include the second insulating film 44b recited above.

The formation of the first insulating portion In1 corresponds to step S130 of FIG. 15.

Subsequently, as shown in FIG. 15, multiple second trenches are formed (step S140 referring to FIG. 15).

Figure 18A:
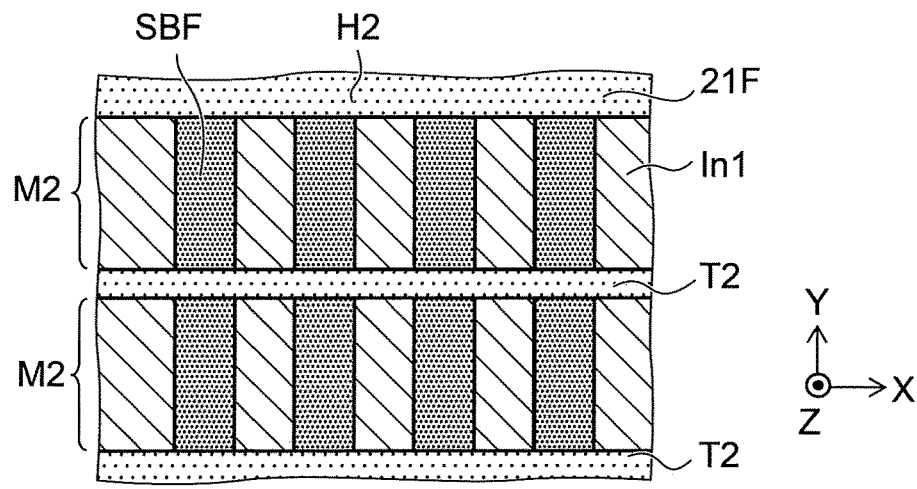
FIG. 18A to FIG. 18C are schematic views illustrating the method for manufacturing the magnetic memory device according to the second embodiment.

For example, as shown in FIG. 18A, a second mask M2 is formed on a patterning body. The second mask M2 has a configuration of multiple band configurations extending along the second direction (the X-axis direction). The patterning body is patterned using the second mask M2. For example, a portion of the first insulating portion In1 and a portion of the stacked film SBF after the first insulating portion In1 is formed are exposed from the opening of the second mask M2 and are removed. Thereby, the multiple second trenches H2 are formed. The multiple second trenches H2 extend in the second direction (e.g., the X-axis direction). As described above, the direction (the third direction) in which the multiple first trenches H1 extend crosses the first direction and the second direction. The second direction may be tilted with respect to the third direction; or the second direction may be perpendicular to the third direction.

For example, the width in the Y-axis direction of the second mask M2 can be changed by the processing (e.g., the irradiation of the ion beam) using the second mask M2. For example, slimming of the second mask M2 is performed. In this processing, for example, a difference of the etching rate can be caused to occur between the stacked film SBF and the first insulating portion In1. For example, the etching rate of the removal of a portion of the stacked film SBF after the first insulating portion In1 is formed is higher than the etching rate of the removal of a portion of the first insulating portion In1. Thereby, for example, the width in the Y-axis direction of one stacked film SBF can be wider than the width in the Y-axis direction of the first insulating portion In1.

Instead of the compound film 43, the stacked insulating portion 45 (including, for example, the first layer 45p, the second layer 45q, the third layer 45r, etc.) described in reference to FIG. 11 may be used. Thereby, the adjustment of the etching rate is easy.

Figure 18B:
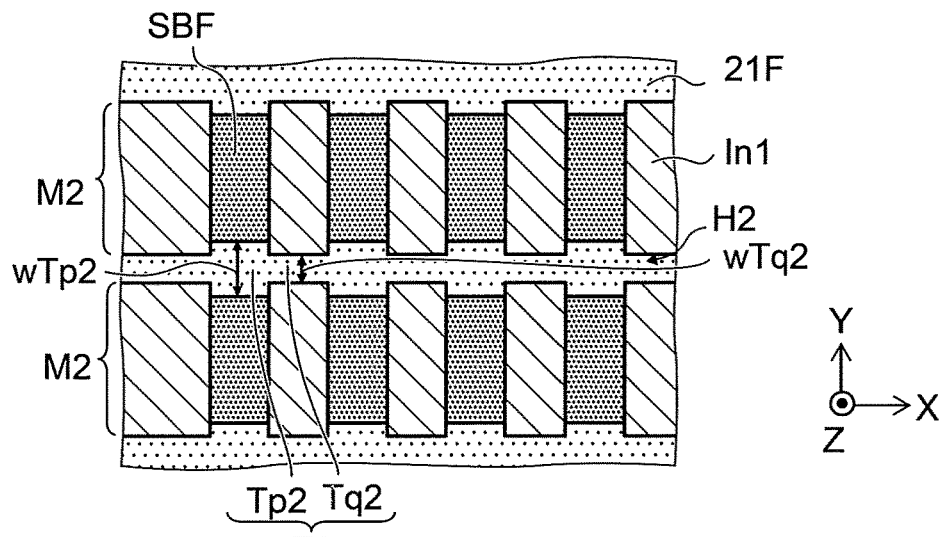

For example, as shown in FIG. 18B, one of the multiple second trenches H2 includes a first trench region Tp2 and a second trench region Tq2. The first trench region Tp2 overlaps the stacked film SBF in the third direction (the Y-axis direction). The second trench region Tq2 overlaps the first insulating portion In1 in the third direction (the Y-axis direction). A width wTp2 along the third direction of the first trench region Tp2 is wider than a width wTq2 along the third direction of the second trench region Tq2.

Subsequently, as shown in FIG. 15, the conductive film 21F that is exposed at the multiple second trenches H2 is removed (step S150). Further, the second insulating portion is formed inside the multiple second trenches H2 (step S160).

Figure 18C:
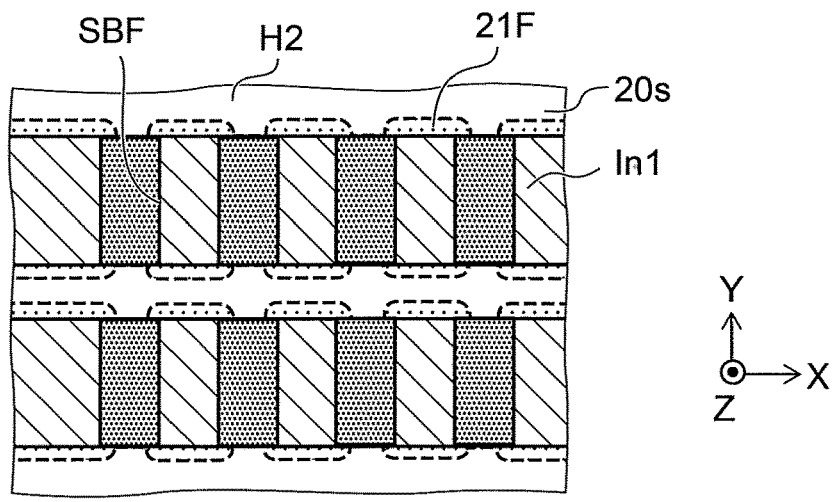

For example, as shown in FIG. 18C, the conductive film 21F that is exposed at the multiple second trenches H2 is removed. The base body 20s that is provided under the removed conductive film 21F is exposed.

Figure 19A:
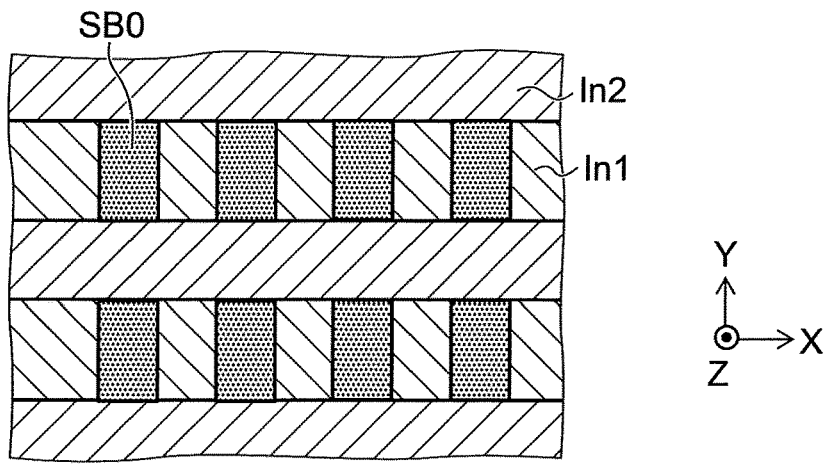
FIG. 19A, and FIG. 19B are schematic views illustrating the method for manufacturing the magnetic memory device according to the second embodiment.

As shown in FIG. 19A, a second insulating portion In2 is formed inside the multiple second trenches H2. In such a case, the material of the second insulating portion In2 may be different from the material of the first insulating portion In1. For example, the first insulating portion In1 includes silicon nitride; and the second insulating portion In2 includes silicon oxide. For example, the first insulating portion In1 includes silicon nitride; and the second insulating portion In2 includes aluminum oxide.

For example, a difference of the stress occurs in the different materials. By using mutually-different materials in the two insulating portions, for example, mutually-different stresses can be obtained. For example, mutually-different stresses are generated between the X-axis direction and the Y-axis direction in the second magnetic layer 12 and the fourth magnetic layer 14. Thereby, uniaxial anisotropy can be generated in these magnetic layers. Thereby, the magnetizations of these magnetic layers are stabilized. Stable memory operations are obtained.

Figure 19B:
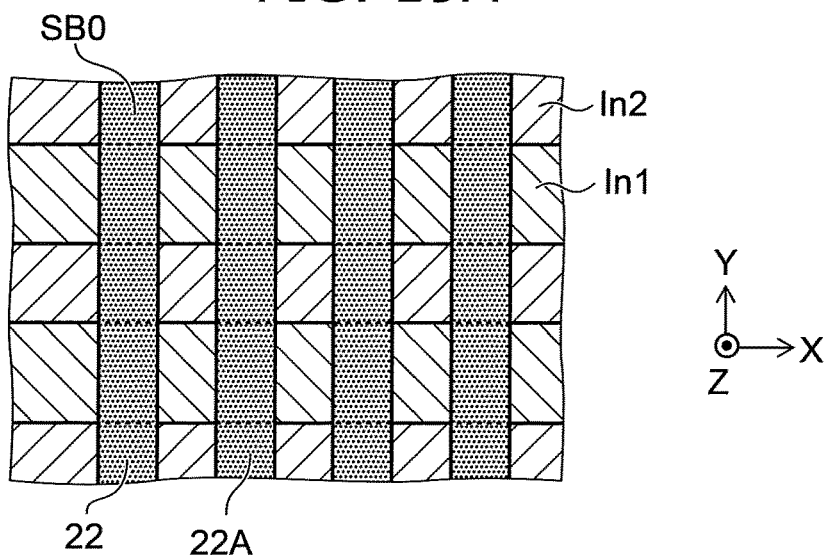

As shown in FIG. 19B, the electrode 22, the electrode 22A, etc., are formed; and the magnetic memory device is made.

According to the manufacturing method recited above, a method for manufacturing a magnetic memory device can be provided in which the storage density can be increased.

Third Embodiment

Figure 20:
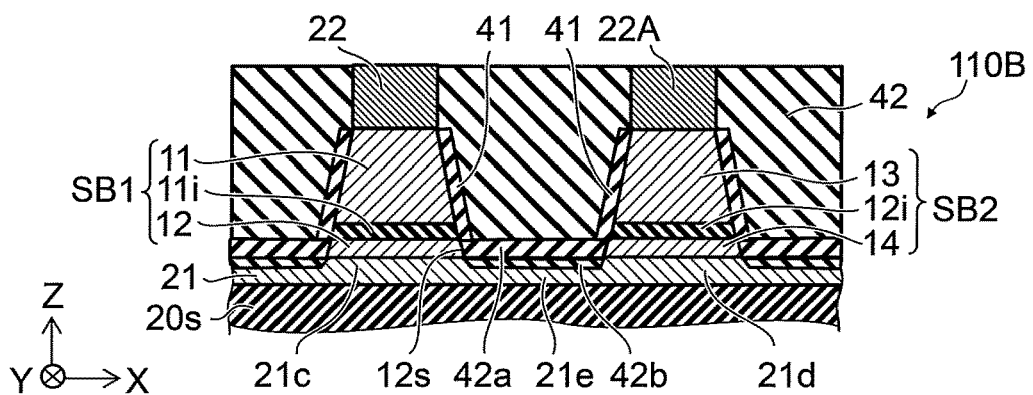
FIG. 20 is a schematic cross-sectional view illustrating a magnetic memory device according to a third embodiment.

FIG. 20 is a schematic cross-sectional view illustrating a magnetic memory device according to a third embodiment.

As shown in FIG. 20, in the magnetic memory device according to the third embodiment 110B, the first insulating portion 41 is provided. The first insulating portion 41 includes a compound including a metal included in the second magnetic layer 12 (or the fourth magnetic layer 14). The first insulating portion 41 may further include a compound including a metal included in the first magnetic layer 11 (or the third magnetic layer 13). The second magnetic layer 12 has a side surface 12s. For example, the side surface 12s crosses the second direction (the X-axis direction). The first insulating portion 41 may oppose the side surface 12s. The fourth magnetic layer 14 has a side surface 14s. For example, the side surface 14s crosses the second direction (the X-axis direction). The first insulating portion 41 may oppose the side surface 14s. For example, leakage current at the side surfaces of the stacked bodies can be suppressed by the first insulating portion 41.

As shown in FIG. 20, a first compound region 42a is provided in another magnetic memory device 110B according to the embodiment. The first compound region 42a includes a compound including a metal included in the second magnetic layer 12 (or the fourth magnetic layer 14). The first compound region 42a opposes the side surface 12s of the second magnetic layer 12 and the side surface 14s of the fourth magnetic layer 14. The first compound region 42a is aligned with the direction (the X-axis direction) connecting the second magnetic layer 12 and the fourth magnetic layer 14 between the second magnetic layer 12 and the fourth magnetic layer 14. For example, the first compound region 42a is provided to be continuous between the second magnetic layer 12 and the fourth magnetic layer 14. For example, the first compound region 42a is formed by processing a portion of the magnetic film used to form the second magnetic layer 12 and the fourth magnetic layer 14. The portions that are not processed are used to form the second magnetic layer 12 and the fourth magnetic layer 14. The processing is oxidizing or nitriding. The processed portion (the first compound region 42a) functions as an insulating film. The processing may include amorphizing.

The first compound region 42a is provided between the second insulating portion 42 and the fifth portion 21e. A second compound region 42b (compound region) may be provided between the first compound region 42a and the fifth portion 21e. A direction from the fifth portion toward the compound region is along the first direction (the Z-axis direction). For example, the second compound region 42b may be formed by changing a portion of the conductive film used to form the conductive layer 21. The second compound region 42b includes, for example, an oxide, nitride, or oxynitride of a metal included in the conductive layer 21.

The second compound region 42b may be formed by the processing of the first compound region 42a recited above. The boundary between the first compound region 42a and the second compound region 42b may be distinct or indistinct. The metal that is included in the second compound region 42b may be diffused into the first compound region 42a. The metal that is included in the first compound region 42a may be diffused into the second compound region 42b.

The first compound region 42a may be discontinuous between the second magnetic layer 12 and the fourth magnetic layer 14. The first compound region 42a may further include a metal included in the first magnetic layer 11 (or third magnetic layer 13).

The first compound region 42a includes a compound including a metal included in the second magnetic layer 12 (or the fourth magnetic layer 14). The first compound region 42a opposes the side surface 12s of the second magnetic layer 12 and the side surface 14s of the fourth magnetic layer 14. The first compound region 42a is provided to be continuous between the second magnetic layer 12 and the fourth magnetic layer 14.

The second compound region 42b is provided between the first compound region 42a and the fifth portion 21e. The second compound region 42b includes, for example, an oxide, nitride, or oxynitride of a metal included in the conductive layer 21.

Fourth Embodiment

Figure 21A:
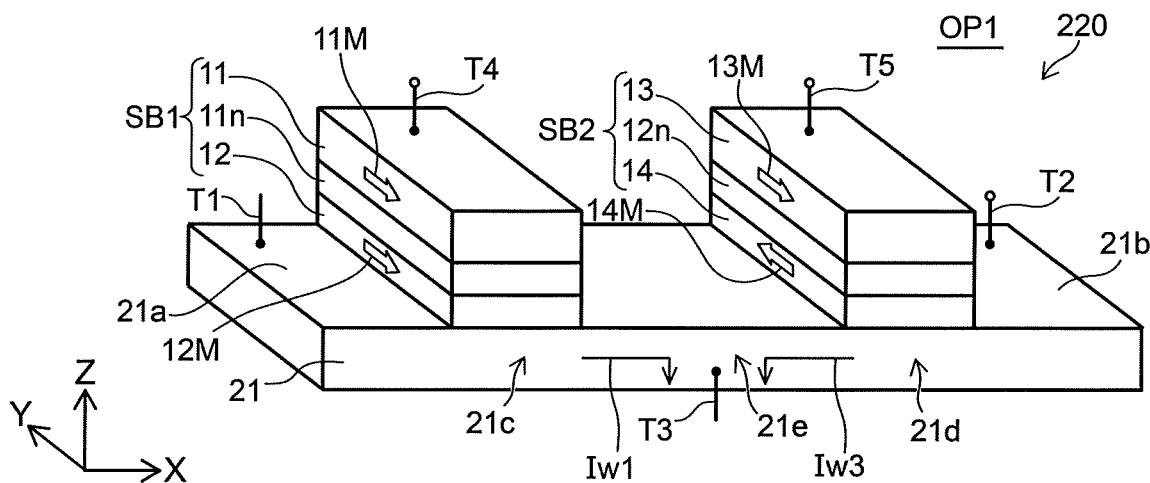
FIG. 21A to FIG. 21C are schematic views illustrating a magnetic memory device according to a fourth embodiment.
Figure 21B:
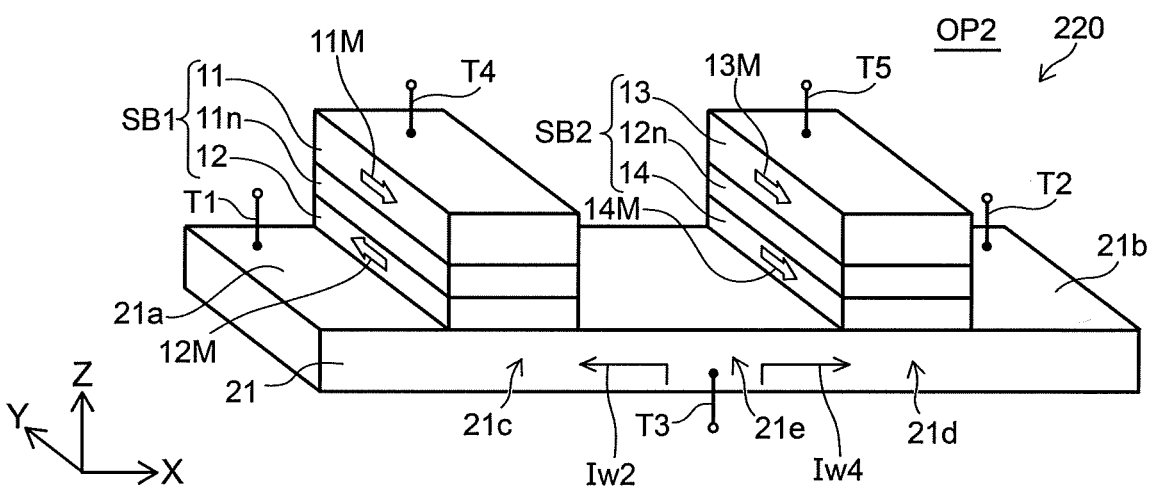
Figure 21C:
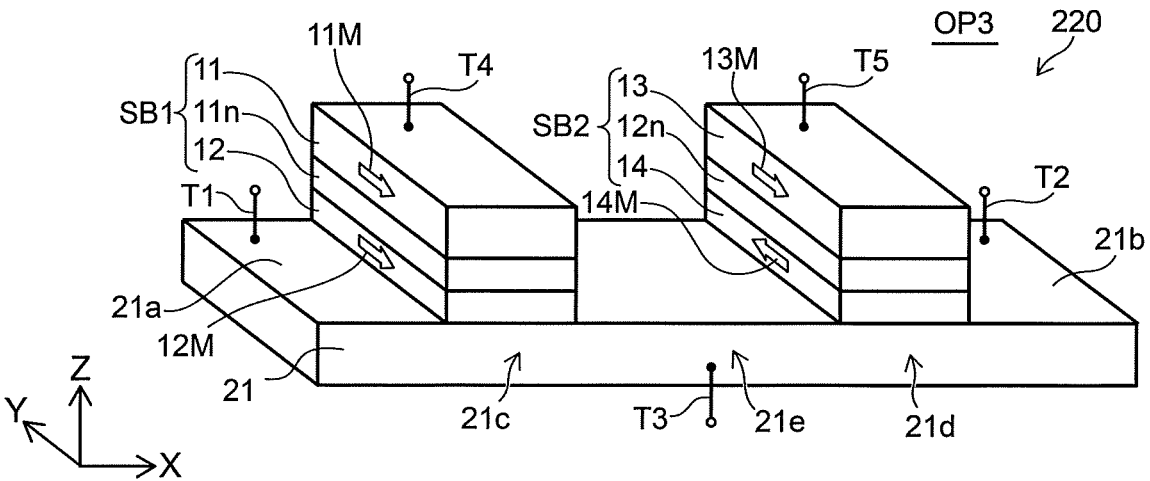

FIG. 21A to FIG. 21C are schematic views illustrating a magnetic memory device according to a fourth embodiment.

As shown in FIG. 21A, in a magnetic memory device 220 according to the embodiment, a plurality of stacked bodies (the first stacked body SB1 and the second stacked body SB2) are provided. In the magnetic memory device 220, the current flowing in the first stacked body SB1 and the current flowing in the second stacked body SB2 are different with each other.

The first stacked body SB1 overlaps the third portion 21c in the first direction (the Z-axis direction). The second stacked body SB2 overlaps the fourth portion 21d in the first direction. The fifth portion 21e of the conductive layer 21 is corresponds to the portion between first stacked body SB1 and second stacked body SB2.

For example, a first terminal T1 is electrically connected with the first portion 21a of the conductive layer 21. A second terminal T2 is electrically connected with the second portion 21b. The third terminal T3 is electrically connected with the fifth portion 21e. The fourth terminal T4 is electrically connected with the first magnetic layer 11. The fifth terminal T5 is electrically connected with the third magnetic layer 13.

As shown in FIG. 21A, in an operation OP1, a first current Iw1 flows from the first terminal T1 toward the third terminal T3, and a third current Iw3 flows from the second terminal T2 toward the third terminal T3. The orientation of the current (first current Iw1) in the position of the first stacked body SB1 is reverse to the orientation of the current (third current Iw3) in the position of second stacked body SB2. In such the operation OP1, the orientation of the spin hole torque which acts on the second magnetic layer 12 of first stacked body SB1 becomes reverse to the orientation of the spin hole torque which act on the fourth magnetic layer 14 of second stacked body SB2.

In another operation OP2 shown in FIG. 21B, a second current Iw2 flows from the third terminal T3 toward the first terminal T1, and a fourth current Iw4 flows from the third terminal T3 toward the second terminal T2. The orientation of the current (the second current Iw2) in the position of the first stacked body SB1 is reverse to the orientation of the current (the fourth current Iw4) in the position of second stacked body SB2. In such the operation OP2, the orientation of the spin hole torque which acts on the second magnetic layer 12 of the first stacked body SB1 becomes reverse to the orientation of the spin hole torque which act on the fourth magnetic layer 14 of second stacked body SB2.

As shown in FIG. 21A and FIG. 21B, the orientation of the fourth magnetization 14M of the fourth magnetic layer 14 is reverse to the orientation of the second magnetization 12M of the second magnetic layer 12. On the other hand, the orientation of the third magnetization 13M of the third magnetic layer 13 is same as that of the first magnetization 11M of the first magnetic layer 11. Thus, the magnetization information having opposite orientation between the first stacked body SB1 and the second stacked body SB2 are memorized. For example, the information (data) in the case of the operation OP1 corresponds to "1." For example, the information (data) in the case of the operation OP2 corresponds to "0." By such operations, high speed reading can be performed, for example, as mentioned later.

In the operation OP1 and the operation OP2, the second magnetization 12M of the second magnetic layer 12 and the spin current of the electron (polarized electron) flowing in the conductive layer 21 interact with each other. The orientation of the second magnetization 12M and the orientation of the spin of the polarized electron become parallel or anti-parallel. The precession movement of the second magnetization 12M of the second magnetic layer 12 is generated to be reversed. In the operation OP1 and the operation OP2, the orientation of the fourth magnetization 14M of the fourth magnetic layer 14 and the orientation of the spin of the polarized electron becomes parallel or anti-parallel. The precession movement of the fourth magnetization 14M of the fourth magnetic layer 14 is generated to be reversed.

FIG. 21C illustrates the reading operation in the magnetic memory device 220.

A potential of the fourth terminal T4 is made to be a fourth potential V4 in reading operation OP3. A potential of the fifth terminal T5 be a fifth potential V5. The fourth potential V4 is an earth potential, for example. Potential difference between the fourth potential V4 and the fifth potential V5 is set to ΔV. Two electrical resistances in each of a plurality of stacked bodies are considered as the high resistance Rh and the low resistance Rl. The high resistance Rh is higher than the low resistance Rl. For example, a resistance when the first magnetization 11M and the second magnetization 12M are anti-parallel corresponds to the high resistance Rh. For example, a resistance when the first magnetization 11M and the second magnetization 12M are parallel corresponds to the low resistance Rl. For example, a resistance when the third magnetization 13M and the fourth magnetization 14M are anti-parallel corresponds to the high resistance Rh. For example, a resistance when the third magnetization 13M and the fourth magnetization 14M are parallel corresponds to the low resistance Rl.

For example, in the operation OP1 ("1" state) illustrated in FIG. 21A, a potential Vr1 of the third terminal T3 is expressed by equation (1).

$$Vr1 = \{Rl/(Rl+Rh)\} \times \Delta V \quad (1)$$

On the other hand, in the state of the operation OP2 ("0" states) illustrated in FIG. 21B, a potential Vr2 of the third terminal T3 is expressed by equation (2).

$$Vr2 = \{Rh/(Rl+Rh)\} \times \Delta V \quad (2)$$

Therefore, the electrical potential change ΔVr between "1" state and "0" states is expressed by equation (3).

$$\Delta Vr = Vr2 - Vr1 = \{(Rh-Rl)/(Rl+Rh)\} \times \Delta V \quad (3)$$

The electrical potential change ΔVr is obtained by measuring the potential of the third terminal T3.

In the above reading operation OP3, the power consumption in the reading operation can be reduced compared with a case where a constant current is supplied to the stacked body (magnetoresistive element) and a voltage (potential difference) between two magnetic layers of the magnetoresistive element is measured, for example. In the above reading operation OP3, a high-speed reading can be performed, for example.

In the above operation OP1 and the operation OP2, a perpendicular magnetic anisotropy of each of the second magnetic layer 12 and the fourth magnetic layer 14 can be control using the fourth terminal T4 and the fifth terminal T5. Thereby, the writing current can be reduced. For example, the writing current is made to be about half of the writing current in the case of the writing without using the fourth terminal T4 and the 5th terminal T5. For example, a writing electric charge can be reduced. A relation of the polarity of the voltage applied to the fourth terminal T4 and the fifth terminal T5 and a change in the perpendicular magnetic anisotropy depend on the material of the magnetic layers and the conductive layer 21.

Figure 22A:
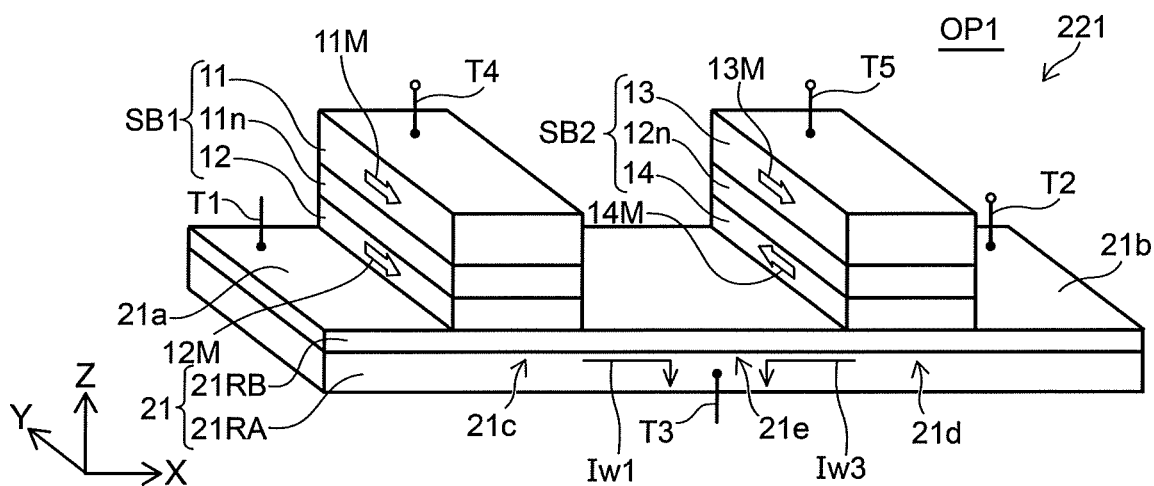
FIG. 22A to FIG. 22C are schematic views illustrating another magnetic memory device according to the fourth embodiment.
Figure 22B:
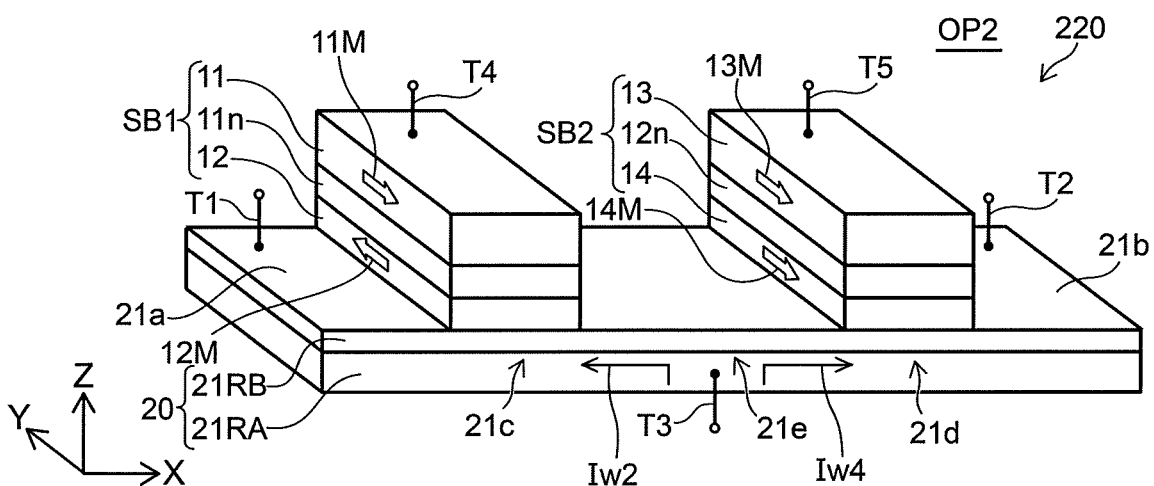
Figure 22C:
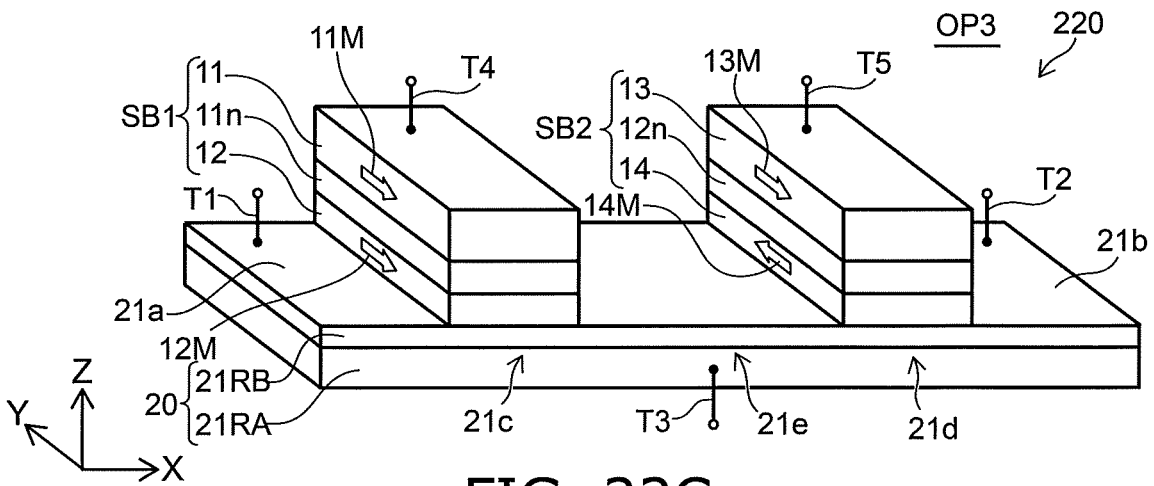

FIG. 22A to FIG. 22C are schematic views illustrating another magnetic memory device according to the fourth embodiment.

As shown in FIG. 22A to FIG. 22C, the conductive layer 21 is provided with a first region 21RA and a second region 21RB in another magnetic memory device 221 according to the embodiment. The second region 21RB is provided between the first region 21RA and the second magnetic layer 12. The second region 21RB physically contacts the second magnetic layer 12, for example. The second domain 22 includes boron. For example, the first region 21RA does not include boron. Or, the first region 21RA includes boron and a first concentration of boron in the first region 21RA is lower than a second concentration of the boron in second domain 21RB. The configuration other than this in the magnetic memory device 221 is same as that of the magnetic memory device 220.

In above-mentioned FIG. 21C, the first terminal T1 and the second terminal T2 may be set at a same potential, the fourth terminal T4 and the fifth terminal T5 may be connected to the input terminal of a sense amplifier, and the potential difference between the fourth terminal T4 and the fifth terminal T5 may be detected with a sense amplifier. A voltage may be applied to either one of the first terminal T1 and the second terminal T2, and the other of the first terminal T1 and the second terminal T2 may be floating. Or a same current is flown in the first terminal T1 and the second terminal T2, and the current difference in the fourth terminal T4 and the fifth terminal T5 may be detected. Furthermore, the first terminal T1 and the second terminal T2 may be set at a same potential, the fourth terminal T4 and the fifth terminal T5 may be connected to the input terminal of the sense amplifier, and the potential difference between the fourth terminal T4 and the fifth terminal T5 may be detected with the sense amplifier. Furthermore, the fourth terminal T4 and the fifth terminal T5 may be set at a same potential, the first terminal T1 and the second terminal T2 may be connected to the input terminal of the sense amplifier, and the potential difference between the first terminal T1 and the second terminal T2 may be detected with the sense amplifier.

According to the embodiments, a magnetic memory device and a method for manufacturing the magnetic memory device can be provided in which the storage density can be increased.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch element such as a transistor, etc.) is inserted between multiple conductive bodies so that a state in which a current flows between the multiple conductive bodies is formable.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic layers, intermediate layers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices, and methods for manufacturing the same practicable by an appropriate design modification by one skilled in the art based on the magnetic memory devices, and the methods for manufacturing semiconductor the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a conductive layer including a first portion, a second portion, and a third portion between the first portion and the second portion;
a first magnetic layer separated from the third portion in a first direction crossing a second direction, the second direction being from the first portion toward the second portion;
a second magnetic layer between the third portion and the first magnetic layer; and
a first intermediate layer between the first magnetic layer and the second magnetic layer, the first intermediate layer being nonmagnetic,
a length along a third direction of at least a portion of the second portion being longer than a third portion length along the third direction of the third portion, the third direction being perpendicular to the first direction and the second direction, wherein the first portion, the second portion, and the third portion extend across a full extent of the conductive layer in the third direction.

2. The device according to claim 1, wherein
the conductive layer has a first surface and a second surface,
the first surface is between the second surface and the second magnetic layer at the second portion,
a length of an outer edge of the second portion in a cross section of the second portion in a first plane perpendicular to the second direction is longer than a sum of a first line segment length, a second line segment length, and 2 times a length along the first direction of the second portion,
the first line segment length is a length of the first surface in the cross section, and
the second line segment length is a length of the second surface in the cross section.

3. The device according to claim 1, wherein
the third portion has a third portion side surface along the second direction,
the second portion has a second portion side surface along the second direction, and
an angle between a second plane and the second portion side surface is smaller than an angle between the second plane and the third portion side surface, and the second plane is parallel to the second direction and the third direction.

4. The device according to claim 1, further comprising:
a first insulating portion; and
a second insulating portion, wherein at least a portion of the first insulating portion is between the second portion and the second insulating portion, and the first insulating portion has at least one of a first thermal conductivity higher than a second thermal conductivity of the second insulating portion or a first specific heat higher than a second specific heat of the second insulating portion.

5. The device according to claim 1, further comprising:

a first insulating portion; and a second insulating portion, wherein at least a portion of the first insulating portion is between the second portion and the second insulating portion, the first insulating portion includes at least one selected from the group consisting of a first compound, a second compound, carbon, and silicon carbide, the first compound includes an oxide of at least one selected from the group consisting of aluminum, beryllium, yttrium, magnesium, and boron, the second compound includes a nitride of at least one selected from the group consisting of aluminum, beryllium, yttrium, magnesium, and boron, and the second insulating portion includes at least one selected from the group consisting of silicon oxide and silicon nitride.

6. The device according to claim 1, further comprising a controller configured to implement:

a first operation of supplying a first current to the conductive layer from the first portion toward the second portion, and a second operation of supplying a second current to the conductive layer from the second portion toward the first portion.

7. The device according to claim 1, wherein the conductive layer includes one of a first element and a second element, the first element includes at least one selected from the group consisting of tantalum and tungsten, and the second element includes at least one selected from the group consisting of platinum and gold.

8. The device according to claim 1, further comprising a compound region, wherein a direction from the second portion toward the compound region is along the first direction, and the compound region includes at least one of an oxide, a nitride, and an oxynitride of a metal included in the conductive layer.

* * * * *